United States Patent
Tokunaga et al.

(10) Patent No.: US 6,907,064 B1
(45) Date of Patent: Jun. 14, 2005

(54) WAVEFORM EQUALIZATION CONTROLLER AND WAVEFORM EQUALIZATION CONTROL METHOD

(75) Inventors: Naoya Tokunaga, Osaka (JP); Kazuya Ueda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 971 days.

(21) Appl. No.: 09/698,020

(22) Filed: Oct. 30, 2000

(30) Foreign Application Priority Data

Oct. 29, 1999 (JP) .......................................... 11-309872

(51) Int. Cl.[7] .............................. H03H 7/30; H03H 7/40
(52) U.S. Cl. ....................... 375/232; 375/229; 375/230
(58) Field of Search ................................. 375/229, 230, 375/231, 232, 233, 234, 235, 236, 237, 238, 239, 316

(56) References Cited

U.S. PATENT DOCUMENTS

| | | | | |
|---|---|---|---|---|
| 5,276,707 A | * | 1/1994 | Baum | 375/233 |
| 5,524,023 A | * | 6/1996 | Tsujimoto | 375/232 |
| 5,644,595 A | * | 7/1997 | Yamasaki et al. | 375/232 |
| 5,654,765 A | * | 8/1997 | Kim | 348/614 |
| 5,684,827 A | * | 11/1997 | Nielsen | 375/232 |
| 5,710,792 A | * | 1/1998 | Fukawa et al. | 375/229 |
| 5,818,876 A | * | 10/1998 | Love | 375/341 |
| 5,914,983 A | * | 6/1999 | Bowser et al. | 375/232 |
| 5,953,380 A | * | 9/1999 | Ikeda | 375/346 |

FOREIGN PATENT DOCUMENTS

| | | |
|---|---|---|
| EP | 0907261 A2 | 4/1999 |
| JP | 11-4288 | 6/1997 |

OTHER PUBLICATIONS

Picchi et al., "Blind Equalization and Carrier Recovery Using a "Stop–and–Go", Decision–Directed Algorithm", IEEE Transactions on Communications, vol. COM–35, No. 9, Sep. 1987.

Jaeho Shin et al., "An Improved Stop–and–Go Algorithm for Blind Equalization", IEICE Transactions on Fundamentals, vol. E79–A, No. 6, Jun. 1996, pp. 784–789.

* cited by examiner

Primary Examiner—Chieh M. Fan
Assistant Examiner—Jason M. Perilla
(74) Attorney, Agent, or Firm—Wenderoth, Lind & Ponack, L.L.P.

(57) ABSTRACT

A waveform equalization controller which combines a follow-up property when the distortion is varied and there is a higher convergence speed at the initial operation, and a higher stability at a low C/N time, and which realizes a high performance and a low cost in a waveform equalizer. The waveform equalization controller controls the updating of a tap coefficient, and comprises a waveform equalizer for reducing a transmission line distortion of an input signal based on a LMS algorithm, an error estimation unit for estimating an error signal from an output signal of the waveform equalizer and outputting the error signal, a step size decision unit for generating a step size having an arbitrary size and outputting the step size, and a coefficient updating amount calculation unit for calculating a tap coefficient updating amount based on the error signal, the step size and a tap coefficient updating data.

7 Claims, 20 Drawing Sheets

Fig.15
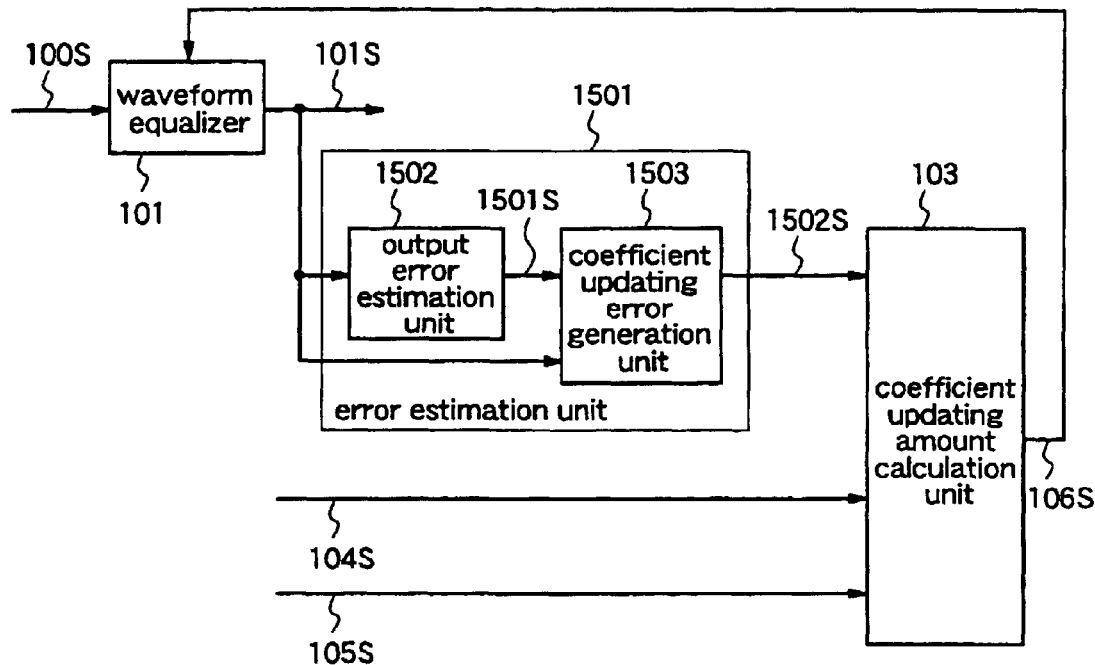
Fig.16 (a)   Fig.16 (b)
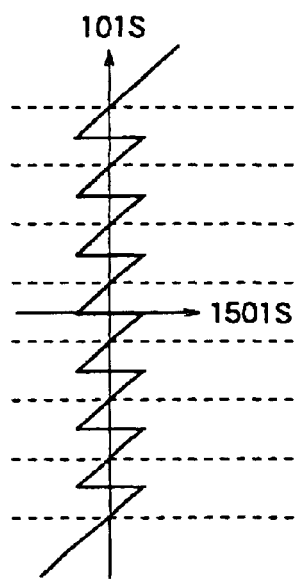 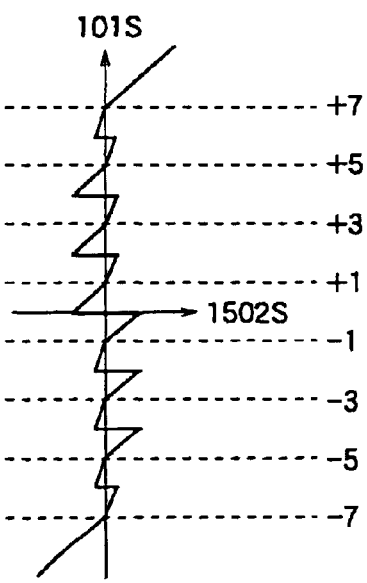

Fig.18 (a)   Fig.18 (b)
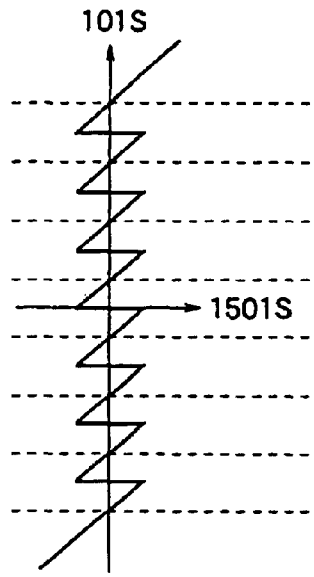
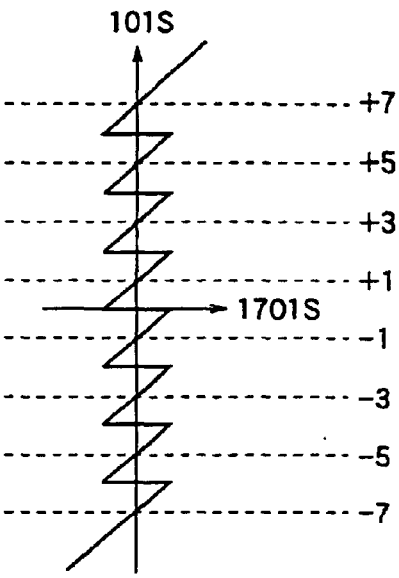
Fig.19 Prior Art
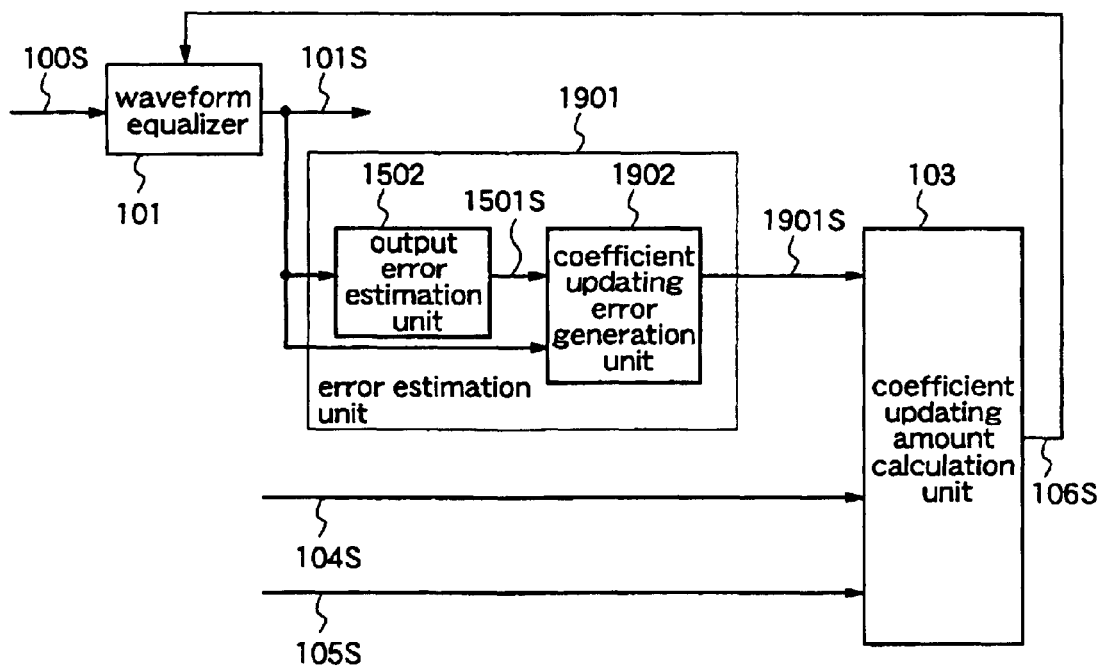

Prior Art
Fig.22 (a)    Fig.22 (b)
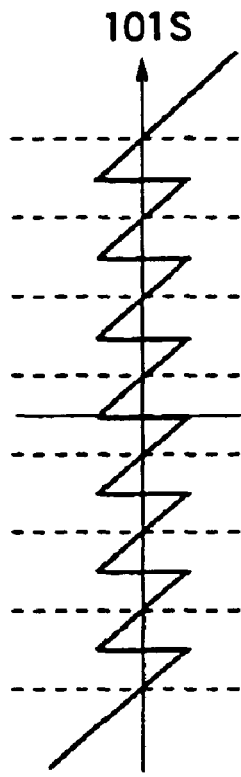
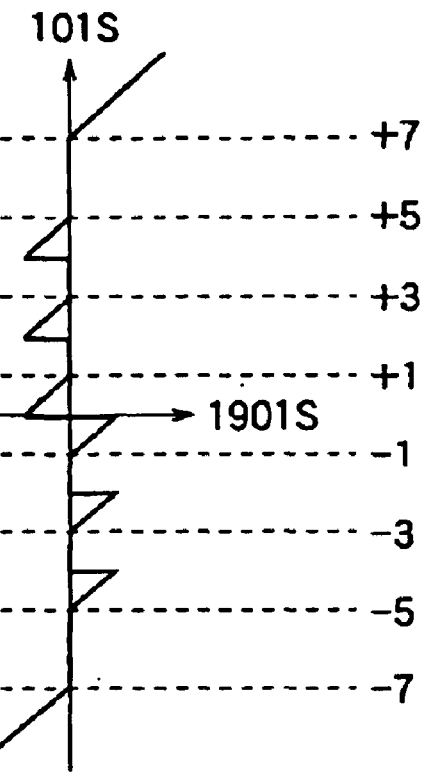

WAVEFORM EQUALIZATION CONTROLLER AND WAVEFORM EQUALIZATION CONTROL METHOD

FIELD OF THE INVENTION

The present invention relates to a waveform equalization controller and, more particularly, to a waveform equalization controller for controlling the updating of tap coefficients of a waveform equalizer which reduces transmission line distortion of a digital signal to be used in digital broadcasting.

BACKGROUND OF THE INVENTION

Originally, digital broadcasting was mainly utilized in satellite broadcasting. However, in recent years, there has been a growing tendency of utilizing digitization in terrestrial broadcasting. In the terrestrial broadcasting, the waveform equalization technique for reducing the transmission line distortion is essential. Hereinafter, a prior art waveform equalization controller in the ground wave digital broadcasting will be described by using a DTV (Digital Television) system utilizing an 8-value VSB (Vestigial Side Band) modulation technique adopted in the U.S. as an example.

FIG. 19 is a block diagram illustrating a structure of the waveform equalization controller in the DTV system.

In FIG. 19, the prior art waveform equalization controller comprises a waveform equalizer 101 for receiving an input signal 100S and outputting an output signal 101S which is obtained by subjecting the input signal 100S to waveform equalization, an error estimation unit 1901 for estimating the error of the output signal 101S and outputting an error signal 1901S, and a coefficient updating amount calculation unit 103 for calculating a tap coefficient updating amount 106S based on a step size 104S, a coefficient updating data 105S to be used for the coefficient update and the error signal 1901S outputted from the error estimation unit 1901. The error estimation unit 1901 comprises an output error estimation unit 1502 for receiving the output signal 101S and outputting an output error signal 1501S, and a coefficient updating error generation unit 1902.

FIG. 20 is a diagram illustrating a structure of a signal format according to the DTV system. As shown in FIG. 20, the signal format according to the DTV system is composed of areas including a data signal 3101 such as video and audio, areas including a field synchronous signal 3102, and an area including a segment synchronous signal 3103.

FIG. 21 is a diagram illustrating a structure of the field synchronous signal 3102. As shown in FIG. 21, the field synchronous signal 3102 includes a PN511 signal 3201, three PN63 signals 3202, and a control signal 3203. The difference between the field synchronous signal #2 and the field synchronous signal #1 is only that the second value in the PN63 signal 3202 is reversed. Values on the lefthand side of FIG. 21 (+7, +5, +3, +1, −1, −3, −5, −7) show 8 kinds of values which are taken on in the 8-value VSB modulation technique. One field of this DTV signal is composed of 832 symbols and 313 segments. The PN511 signal 3201 is obtained by generating a polynomial: $PN511=(X^9)+(X^7)+(X^6)+(X^4)+(X^3)+(X+1)$ (in this polynomial, "A" shows the power) and is represented by Pre-load 010000000 (a binary representation of the initial value). The PN63 signal 3202 is obtained by $PN63=(X^6)+(X+1)$ and is represented by Pre-load 100111. The PN511 signal 3201 is composed of 511 symbols. Each of the PN63 signals 3202 is composed of 63 symbols. The control signal 3203 is composed of 128 symbols. Accordingly, the entire field synchronous signal 3102 is composed of 828 symbols.

Next, the operation of the prior art waveform equalization controller is described with reference to the drawings. As shown in FIG. 19, in the waveform equalization controller according to the DTV system, the waveform equalizer 101 performs the waveform equalization to the DTV signal which has been subjected to the 8-value modulation (the input signal 100S) so as to reduce the distortion, and generates the output signal 101S. then, the output error estimation unit 1502 generates the error between the output signal 101S and the most likely one of the 8 kinds of symbol values as the output error signal 1501S. FIGS. 22(a) and 22(b) show the relationship between the output error signal 1501S and the error signal 1901S. The output error signal 1501S shown in FIG. 22(a) is converted by the coefficient updating error generation unit 1902 into the error signal 1901S as shown in FIG. 22(b) according to the value of the output signal 101S based on the Stop&Go algorithm described in "Blind Equalization and Carrier Recovery Using a "Stop-and-Go", in Decision-Directed Algorithm IEEE TRANSACTIONS ON COMMUNICATIONS, VOL. COM35, NO.9, SEPTEMBER 1987, pp. 877–887". The coefficients updating amount calculation unit 103 generates the tap coefficient updating amount 106S based on a LMS (Least Mean Square) algorithm by using the error signal 1901S, the step size 104S and the coefficient updating data 105S.

The LMS algorithm is the algorithm of performing the n-th update of tap coefficient Ci of tap i in a transversal filter in the waveform equalizer 101 based on the following Expression 1.

$$Ci(n+1)=Ci(n)-\alpha \times e(n) \times di(n) \quad \text{(Expression 1)}$$

Here, α denotes the step size 104S, e(n) denotes the error signal 1901S, di(n) denotes the coefficient updating data 105S, and −α×e(n)×di(n) denotes the tap coefficient updating amount 106S. Here, the coefficient updating data 105S is a data in tap i at the n-th updating.

There are two methods for generating the output error signal 1501S in the output error estimation unit 1502. One of the methods is capturing the PN511 signal 3201 and the PN63 signal 3203 included in the field synchronous signal 3102 in the DTV signal, comparing the signals with ideal values of the PN511 signal 3201 and the PN63 signal 3202, and outputting the error thereof as the output error signal 1501S.

The other method is comparing a data signal 3101 which is inserted in the data period of the DTV signal with the nearest fixed value of the 8-value VSB modulation, and outputting the error thereof as the output error signal 1501S.

Since the 8-value VSB modulation technique is used in the example described herein, the DTV signal has 8 kinds of values (+7, +5, +3, +1, −1, −3, −5, −7) as shown in FIG. 21. However, when the DTV signal which has been subjected to the 8-value VSB modulation is received, the DTV signal is generally quantized in about 10 bits. For example, in the case where the DTV signal which has been quantized in 10 bits does not have any distortion, only 8 kinds of fixed values can be taken on for the values which are represented by 10 bits (0 to 1023). The output error estimation unit 1502 calculates the error for the field synchronous signal 3102 of the input DTV signal from the ideal values of the PN511 signal 3201 and PN63 signal 3202, calculates the error for the data signal 3101 from the nearest value among the 8 kinds of fixed values, and outputs the error as the output error signal 1501S.

The prior art waveform equalization controller is constructed as described above and when this waveform equalization controller is used, it is possible that the waveform equalizer can be controlled and the DTV signal whose distortion is reduced can be obtained.

To be specific, the transmission line distortion of the input signal is estimated, and the learning control is performed so as to update the tap coefficient of the transversal filter that is included in the waveform equalizer in steps of a step size each time so that the distortion is cancelled out. Thereby, the signal whose transmission line distortion is reduced can be obtained as the output signal of the waveform equalizer.

However, the prior art waveform equalization controller has the following problems.

The first problem is that the step size, as the update step, of the tap coefficient is fixed. Generally, when the step size is increased, the follow-up property suffers in the case where the distortion is varied or the convergence speed at the initial operation is increased. On the other hand, the waveform equalization controller is easily affected by noises, and thus, the stability at the time of a low C/N is decreased. Conversely, when the step size is reduced, the controller is hard to be affected by the noises and the stability at the low C/N time is increased. However, when the distortion is varied, the follow-up property to the variation or the convergence speed of the waveform equalization operation at the initial operation is reduced.

The second problem is that two multipliers are required in the coefficient updating amount calculation unit to calculate the coefficient updating amount of one tap, and as a result, the circuit scale becomes larger.

The third problem is that when it is judged as "Stop" in the Stop&Go algorithm, the coefficient updating amount calculation unit 1902 outputs "0" up to the next iteration (update of the tap coefficient). Thus, the coefficient updating amount calculation unit 1902 is not utilized effectively as well as the follow-up property in the case where the distortion is varied or the convergence speed at the initial operation is reduced.

SUMMARY OF THE INVENTION

It is an object of the present invention to provide a waveform equalization controller which has both of a good follow-up property in the case where the distortion of the signal is varied or the higher convergence speed at the initial operation and the good stability at the low C/N time, and realizes a high performance at a low cost.

Other objects and advantages of the present invention will become more apparent from the following detailed description, and specific embodiments described herein are provided only for illustration since various additions and modifications within the spirit and scope of the present invention will be apparent to those skilled in the art from the detailed description.

A waveform equalization controller according to a first aspect of the present invention comprises a waveform equalizer for reducing a transmission line distortion of an input signal based on a LMS algorithm, and controls the updating of a tap coefficient of a filter which is included in the waveform equalizer. The waveform equalization controller of the first aspect also comprises: an error estimation unit for estimating an error of an output signal of the waveform equalizer from the output signal, and outputting an error signal; a step size decision unit for receiving the error signal and a step size upper limit value and a step size lower limit value being an upper limit value and a lower limit value of a step size as a step for updating the tap coefficient, adaptively generating a step size which corresponds to the error signal in a range of the step size upper limit value or smaller and the step size lower limit value or larger, and outputting the generated step size; and a coefficient updating amount calculation unit for calculating a tap coefficient updating amount based on the error signal, the generated step size and a data to be used for the tap coefficient update. Therefore, according to the first aspect, a waveform equalization controller which has a follow-up property in the case where the transmission line distortion of the input signal is varied and a higher convergence speed at the initial operation, is hardly affected by noises, and has a higher stability at a low C/N time can be realized.

According to a second aspect of the present invention, in accordance with the waveform equalization controller of the first aspect, the step size decision unit comprises: a multiplier for squaring the error signal so as to generate a square error; a square error storage unit for containing (storing) the square error which has been generated at a previous tap coefficient update; a subtracter for generating a difference between the square errors, which is a difference between the square error that is outputted from the multiplier and the square error stored in the square error storage unit which was generated at the previous tap coefficient update; a first comparator for comparing the square error with a first threshold; a second comparator for comparing the square error with a second threshold; a third comparator for comparing an absolute value of the difference between the square errors with a third threshold; a step size storage unit for containing a step size which has been used at the previous tap coefficient updates; and a step size increasing/decreasing unit for receiving the step size which has been stored in the step size storage unit, an output of the first comparator, an output of the second comparator, an output of the third comparator, the step size upper limit value and the step size lower limit value, and generating a step size which is to be used for this tap coefficient update. Therefore, according to the second aspect, the waveform equalization controller which has a follow-up property in the case where the transmission line distortion of the input signal is varied and a higher convergence speed at the initial operation, is hardly affected by noises, and has a higher stability at a low C/N time can be realized.

According to a third aspect of the present invention, in accordance with the waveform equalization controller of the second aspect, the second threshold is such a value that when the square error is larger than the value of the second threshold the waveform equalizer is trending toward divergence; the first threshold is such a value that when the square error is smaller than the value of the first threshold, the waveform equalizer is either converging or has converged; the third threshold is such a value that in the case where the square error is smaller than the first threshold, when an absolute value of the difference between the square errors is larger than the third threshold, the waveform equalizer is converging, and when the absolute value is equal to or smaller than the third threshold the waveform equalizer has converged. Further, in the third aspect, the step size increasing/decreasing unit decreases the step size by a predetermined amount when it is judged from comparison results of the first to third comparators that the square error is larger than the second threshold, decreases the step size by a predetermined amount when the square error is smaller than the first threshold and the absolute value of the difference between the square errors is equal to or smaller than the third threshold, increases the step size by a predetermined amount when the square error is smaller than the first threshold and the absolute value of the difference between the square errors is larger than the third threshold, and does not change the step size in other cases. Therefore, the suitable step size is obtained according to the state of the waveform equalizer. Thereby, according to the third aspect, a waveform equalization controller which has a follow-up property in the case where the transmission line distortion of the input signal is varied and a higher convergence speed at the initial operation, is hardly affected by noises, and has a higher stability at a low C/N time can be realized.

According to a fourth aspect of the present invention, in accordance with the waveform equalization controller of the second aspect, the second threshold is such a value that when the square error is larger than the value of the second threshold, the waveform equalizer is trending toward divergence; the first threshold is such a value that when the square error is smaller than the value of the first threshold, the waveform equalizer is either converging or has converged; the third threshold is such a value that in the case where the square error is smaller than the first threshold, when an absolute value of the difference between the square errors is larger than the third threshold, the waveform equalizer is converging, and when the absolute value is equal to or smaller than the third threshold, the waveform equalizer has converged. Further, in the fourth aspect, and the step size increasing/decreasing unit decreases the step size at a predetermined rate when it is judged from comparison results of the first to third comparators that the square error is larger than the second threshold, decreases the step size at a predetermined rate when the square error is smaller than the first threshold and the absolute value of the difference between the square errors is equal to or smaller than the third threshold, increases the step size at a predetermined rate when the square error is smaller than the first threshold and the absolute value of the difference between the square errors is larger than the third threshold, and does not change the step size in other cases. Therefore, according to the fourth aspect, a waveform equalization controller which has a follow-up property in the case where the transmission line distortion of the input signal is varied and a higher convergence speed at the initial operation, is hardly affected by noises, and has a higher stability at a low C/N time can be realized.

A waveform equalization controller according to a fifth aspect of the present invention comprises a waveform equalizer for reducing a transmission line distortion of an input signal based on a LMS algorithm, and controls the updating of a tap coefficient of a filter which is included in the waveform equalizer. The waveform equalization controller of the fifth aspect also comprises: an error estimation unit for estimating an error of an output signal of the waveform equalizer from the output signal, and outputting an error signal; a signal judgement unit for judging whether a probability of a judgement error in the error estimation for the output signal is larger or smaller, and outputting a judgement signal; a step size decision unit for receiving the judgement signal and outputting a value according to the judgement signal as a step size which is a step for updating the tap coefficient; and a coefficient updating amount calculation unit for calculating a tap coefficient updating amount based on the error signal, the step size, and a data to be used for the tap coefficient update. Therefore, the step size can be increased according to the probability of the judgement error for the output signal, and as a result, according to the fifth aspect, a waveform equalization controller which has a follow-up property in the case where the transmission line distortion of the input signal is varied and a higher convergence speed at the initial operation can be realized.

According to a sixth aspect of the present invention, in accordance with the waveform equalization controller of the fifth aspect, the signal judgement unit is operable to output three kinds of the judgement signal: a judgement signal indicating that the output signal is known; a judgement signal indicating that the probability of the judgement error for the output signal is smaller, and a judgement signal indicating that the probability of the judgement error for the output signal is larger. Therefore, the step size can be increased or decreased according the probability of the judgement error for the output signal, and as a result, according to the sixth aspect, a waveform equalization controller which has a follow-up property in the case where the transmission line distortion of the input signal is varied and a higher convergence speed at the initial operation can be realized.

According to a seventh aspect of the present invention, in accordance with the waveform equalization controller of the sixth aspect, the step size decision unit outputs a first step size set value as the step size when the judgement signal indicates that the output signal is known, outputs a second step size set value which is smaller than the first step size set value when the judgement signal indicates that the probability of the judgement error for the output signal is smaller, and outputs a third step size set value which is smaller than the second step size set value when the judgement signal indicates that the probability of the judgement error for the output signal is larger. Therefore, the step size can be increased or decreased according to the probability of the judgement error for the output signal, and as a result, according to the seventh aspect, a waveform equalization controller which has a follow-up property in the case where the transmission line distortion of the input signal is varied and a higher convergence speed at the initial operation can be realized.

A waveform equalization controller according to an eighth aspect of the present invention comprises a waveform equalizer for reducing a transmission line distortion of an input signal based on a LMS algorithm, and controls the updating of a tap coefficient of a filter which is included in the waveform equalizer. The waveform equalization controller of the eight aspect also comprises: an error estimation unit for estimating an error of the output signal of the waveform equalizer from the output signal, and outputting an error signal; a step size decision unit for receiving the error signal, a threshold and plural step size set values, and deciding a step size as a step for updating the tap coefficient; and a coefficient updating amount calculation unit for calculating a tap coefficient updating amount based on the error signal, the step size and a data to be used for the tap coefficient update. Therefore, one of the step sizes can be selected according to the relationship between the error signal and the thresold, and as a result, according to the eighth aspect, a waveform equalization controller which has a follow-up property in the case where the transmission line distortion of the input signal is varied and a higher convergence speed at the initial operation can be realized.

According to a ninth aspect of the present invention, in accordance with the waveform equalization controller of the eighth aspect, the plural step size set values are a first step size set value and a second step size set value which is larger than the first step size set value. Further, in the ninth aspect, and the step size decision unit comprises: a comparator for comparing an absolute value of the error signal with the threshold; and a selector for selecting one of the first step size set value and the second step size set value based on a comparison result that is outputted from the comparator, and outputting the selected step size as the step size. Therefore, one of the step sizes can be selected based on the result of the comparison between the error signal and the threshold, and as a result, according to the ninth aspect, a waveform equalization controller which has a follow-up property in the case where the transmission line distortion of the input signal is varied and a higher convergence speed at the initial operation can be realized.

According to a tenth aspect of the present invention, in accordance with the waveform equalization controller of the ninth aspect, the threshold value is such a value that when the absolute value of the error signal is equal to or smaller than the threshold, the waveform equalizer has nearly converged. Further, in the tenth aspect, the step size decision unit ouputs the first step size set value as the step size when the absolute value of the error signal is equal to or smaller than the threshold, and outputs the second step size set value as the step size when the absolute value of the error signal exceeds the threshold. Therefore, based on the result of the comparison between the error signal and the threshold by the comparator, the larger step size can be selected when it is judged that the waveform equalizer has not converged yet. Thus, according to the tenth aspect, a waveform equalization controller which has a follow-up property in the case where the transmission line distortion of the input signal is varied and a higher convergence speed at the initial operation can be realized.

A waveform equalization controller according to an eleventh aspect of the present invention comprises a waveform equalizer for reducing a transmission line distortion of an input signal based on a LMS algorithm, and controls update of a tap coefficient of a filter included in the waveform equalizer. The waveform equalization controller of the eleventh aspect also comprises: an error estimation unit for estimating an error of an output signal of the waveform equalizer from the output signal, and outputting an error signal; an error quantization unit for converting the error signal into a quantized error signal having a value of the powers of 2, and outputting the quantized error signal; and a coefficient updating amount calculation unit for calculating a tap coefficient updating amount based on the quantized error signal, the step size as a step for updating the tap coefficient and a data to be used for the tap coefficient update. Therefore, the two-time multiplication which is required in the prior art can be replaced with one multiplication and one shift operation. Thus, according to the eleventh aspect, a waveform equalization controller which attains the same performance as the prior art as well as has a small circuit scale can be realized.

According to twelfth aspect of the present invention, in accordance with the waveform equalization controller of the eleventh aspect, the error quantization unit converts the error signal into the quantized error signal having the same sign as the error signal and a maximum absolute value which is equal to or smaller than an absolute value of the error signal among the powers of 2, and outputs the quantized error signal. Therefore, the two-time multiplication that is required to obtain the tap coefficient updating amount in the prior art can be replaced with one multiplication and one shift operation in the twelfth aspect. Thus, according to the twelfth aspect, a waveform equalization controller which attains the same performance as the prior art but which has a small circuit scale can be realized.

According to a thirteenth aspect of the present invention, in accordance with the waveform equalization controller of the eleventh aspect, the error quantization unit converts the error signal into the quantized error signal having the same sign as the error signal and a minimum absolute value which is equal to or larger than an absolute value of the error signal among the powers of 2, and outputs the quantized error signal. Therefore, the two-time multiplication that is required to obtain the tap coefficient updating amount in the prior art can be replaced with one multiplication and one shift operation in the thirteenth aspect. Thus, according to the thirteenth aspect, the waveform equalization controller which attains the same performance as the prior art but which has a small circuit scale can be realized.

A waveform equalization controller according to a fourteenth aspect of the present invention comprises a waveform equalizer for reducing a transmission line distortion of an input signal based on a LMS algorithm, and controls update of a tap coefficient of a filter which is included in the waveform equalizer. The waveform equalization controller of the fourteenth aspect also comprises: an error estimation unit for estimating an error of an output signal of the waveform equalizer from the output signal, and outputting an error signal; a data quantization unit for converting a data to be used for the tap coefficient update into a quantized data having a value of powers of 2, and outputting the quantized data; and a coefficient updating amount calculation unit for calculating a tap coefficient updating amount based on the error signal, a step size as a step for updating the tap coefficient, and the quantized data. Therefore, the two-time multiplication which is required in the prior art can be replaced with one multiplication and one shift operation, and as a result, according to the fourteenth aspect, a waveform equalization controller which attains the same performance as the prior art but which has a small circuit scale can be realized.

According to a fifteenth aspect of the present invention, in accordance with the waveform equalization controller of the fourteenth aspect, the data quantization unit converts the data to be used for the tap coefficient update into a quantized data having the same sign as the data to be used for the tap coefficient update and a maximum absolute value which is equal to or smaller than an absolute value of the data to be used for the tap coefficient update among the powers of 2, and outputs the quantized date. Therefore, the two-time multiplication that is required to obtain the tap coefficient updating amount in the prior art can be replaced with one multiplication and one shift operation in the fifteenth aspect. Thus, according to the fifteenth aspect, a waveform equalization controller which attains the same performance as the prior art but which has a small circuit scale can be realized.

According to a sixteenth aspect of the present invention, in accordance with the waveform equalization controller of the fourteenth aspect, the data quantization unit converts the data to be used for the tap coefficient update into a quantized data having the same sign as the data to be used for the tap coefficient update and a minimum absolute value which is equal to or larger than an absolute value of the data to be used for the tap coefficient update among the powers of 2, and outputs the quantized data. Therefore, the two-time multiplication that is required to obtain the tap coefficient updating amount in the prior art can be replaced with one multiplication and one shift operation in the sixteenth aspect. Thus, according to the sixteenth aspect, a waveform equalization controller which attains the same performance as the prior art but which has a small circuit scale can be realized.

A waveform equalization controller according to a seventeenth aspect of the present invention comprises a waveform equalizer for reducing a transmission line distortion of an input signal based on a LMS algorithm, and controls the updating of a tap coefficient of a filter which is included in the waveform equalizer. The waveform equalization controller of the seventeenth aspect also comprises: an error estimation unit for estimating an error of an output signal of the waveform equalizer from the output signal, and outputting an error signal; a step size quantization unit for converting a step size as a step for updating the tap coefficient into a quantized step size having a value of the powers of 2, and outputting the quantized step size; and a coefficient updating amount calculation unit for calculating a tap coefficient updating amount based on the error signal, the quantized step size, and a data to be used for the tap coefficient update. Therefore, the two-time multiplication which is required in the prior art can be replaced with one multiplication and one shift operation in the seventeenth aspect. Thus, according to the seventeenth aspect, a waveform equalization controller which attains the same performance as the prior art as well but which has a small circuit scale can be realized.

According to an eighteenth aspect of the present invention, in accordance with the waveform equalization controller of the seventeenth aspect, the step size quantization unit converts the step size into the quantized step size having a maximum value which is equal to or smaller than the step size among the powers of 2, and outputs the quantized step size. Therefore, the two-time multiplication that is required to obtain the tap coefficient updating amount in the prior art can be replaced with one multiplication and one shift operation in the eighteenth aspect. Thus, according to the eighteenth aspect, a waveform equalization controller which attains the same performance as the prior art but which has a small circuit scale can be realized.

According to a nineteenth aspect of the present invention, in accordance with the waveform equalization controller of the seventeenth aspect, the step size quantization unit converts the step size into the quantized step size having a minimum value which is equal to or larger than the step size among the powers of 2, and outputs the quantized step size. Therefore, the two-time multiplication that is required to obtain the tap coefficient updating amount in the prior art can be replaced with one multiplication and one shift operation in the nineteenth aspect. Thus, according to the nineteenth aspect, a waveform equalization controller which attains the same performance as the prior art but which has a small circuit scale can be realized.

A waveform equalization controller according to a twentieth aspect of the present invention comprises a waveform equalizer for reducing a transmission line distortion of an input signal based on a LMS algorithm, and controls the updating of a tap coefficient of a filter which is included in the waveform equalizer. The waveform equalization controller of the twentieth aspect also comprises: an error estimation unit for estimating an error of an output signal of the waveform equalizer from the output signal, and outputting an error signal which is obtained by making the estimated error 0 when the estimated error is an error corresponding to a predetermined range of the output signal; a coefficient updating amount calculation unit for calculating a tap coefficient updating amount based on the error signal, a step size as a step for updating the tap coefficient, and a data to be used for the tap coefficient update; and a coefficient update timing control unit for receiving the error signal and outputting a update timing signal which controls a timing when the coefficient updating amount calculation unit calculates the tap coefficient updating amount at intervals of plural symbols. Therefore, the tap coefficient updating amount is calculated by the coefficient updating amount calculation unit when the error signal is not "0", and as a result, the coefficient updating interval can be reduced with regard to the waveform equalization controller which performs the coefficient update at a predetermined symbol intervals. Thus, according to the twentieth aspect, a waveform equalization controller which has a follow-up property in the case where the transmission line distortion of the input signal is varied and a higher convergence speed at the initial operation can be realized.

According to a twenty-first aspect of the present invention, in accordance with the waveform equalization controller of the twentieth aspect, the coefficient update timing control unit controls the timing of the coefficient updating amount calculation unit calculating the tap coefficient updating amount to be at a first symbol after an interval of predetermined symbols or more from a previous timing and when the error signal is not 0. Therefore, the coefficient updating interval can be reduced with regard to the waveform equalization controller which performs the coefficient update at previously determined symbol intervals. Thus, according to the twenty-first aspect, a waveform equalization controller which has a follow-up property in the case where the transmission line distortion of the input signal is varied and a higher convergence speed at the initial operation can be realized.

A waveform equalization controller according to a twenty-second aspect of the present invention comprises a waveform equalizer for reducing a transmission line distortion of an input signal based on a LMS algorithm, and controls the updating of a tap coefficient of a filter which is included in the waveform equalizer. The waveform equalization controller of the twenty-second aspect also comprises: an error estimation unit including an output error estimation unit for receiving an output signal of the waveform equalizer and outputting an output error signal, and a coefficient updating error generation unit for receiving the output error signal and the output signal and outputting an error signal which is obtained by reducing a partial section of the output error signal at a predetermined rate; and a coefficient updating amount calculation unit for calculating a tap coefficient updating amount based on the error signal, a step size as a step for the update of the tap coefficient, and a data to be used for the tap coefficient update. Therefore, the output error signal which has been converted into "0" by the coefficient updating error generation unit is converted into an error signal which is obtained by multiplying the output error signal by a predetermined rate so as to decrease the value. Thus, the error signal which can be used for the tap coefficient update is increased in number as compared to a Stop&Go algorithm. Therefore, according to the twenty-second aspect, a waveform equalization controller which has a follow-up property in the case where the transmission line distortion of the input signal is varied and a higher convergence speed at the initial operation can be realized.

A waveform equalization controller according to a twenty-third aspect of the present invention comprises a waveform equalizer for reducing a transmission line distortion of an input signal based on a LMS algorithm, and controls the updating of a tap coefficient of a filter which is included in the waveform equalizer. The waveform equalization controller of the twenty-third aspect also comprises: an error rate measuring circuit for receiving an output signal of the waveform equalizer and generating an error rate signal which indicates a rate of an error that is included in the output signal; an error estimation unit including an output error estimation unit for receiving the output signal of the waveform equalizer and outputting an output error signal, and a coefficient updating error generation unit for receiving the output error signal, the output signal and the error rate signal and outputting an error signal; and a coefficient updating amount calculation unit for calculating a tap coefficient updating amount based on the error signal, a step size as a step for the update of the tap coefficient, and a data to be used for the tap coefficient update. Therefore, the update interval of the tap coefficient is reduced, and further, the error signal which can be used for the tap coefficient update is increased in number. Thus, according to the twenty-third aspect, a waveform equalization controller which has a follow-up property in the case where the transmission line distortion of the input signal is varied and a higher convergence speed at the initial operation can be realized.

According to a twenty-fourth aspect of the present invention, in accordance with the waveform equalization controller of they twenty-third aspect, the coefficient updating error generation unit outputs the same value as the output error signal, as the error signal, when it is detected from the error rate signal that the rate of the error that is included in the output signal is smaller than a predetermined rate. Therefore, the update interval of the tap coefficient is reduced, and further, the error signal which can be used for the tap coefficient update is increased in number. Thus, according to the twenty-fourth aspect a waveform equalization controller which has a follow-up property in the case where the transmission line distortion of the input signal is varied and a higher convergence speed at the initial operation can be realized.

A waveform equalization control method according to a twenty-fifth aspect of the present invention controls the updating of a tap coefficient of a filter which is included in a waveform equalizer for reducing a transmission line distortion of an input signal based on a LMS algorithm. The waveform equalization control method of the twenty-fifth aspect comprises: an error estimation step of estimating an error of an output signal of the waveform equalizer from the output signal, and generating an error signal; a step size decision step of adaptively deciding a step size in a range of a step size upper limit value as an upper limit value of a step size, which is a step for updating the tap coefficient, or smaller, and a step size lower limit value as a lower limit value of the step size or larger, based on the error signal; and a coefficient updating amount calculation step of calculating a tap coefficient updating amount based on the error signal, the step size and a data to be used for the tap coefficient update. Therefore, according to the twenty-fifth aspect, a waveform equalization control method which has a follow-up property in the case where the transmission line distortion of the input signal is varied and a higher convergence speed at the initial operation, is hardly affected by noises, and has a higher stability at a low C/N time can be realized.

According to a twenty-sixth aspect of the present invention, in accordance with the waveform equalization control method of the twenty-fifth aspect, the step size decision step comprises: a multiplication step of squaring the error signal so as to generate a square error; a subtraction step of generating a difference between square errors, which is a difference between the square error generated at a previous tap coefficient update and the square error generated in the multiplication step; a first comparison step of comparing the square error with a first threshold; a second comparison step of comparing the square error with a second threshold; a third comparison step of comparing an absolute value of the difference between the square errors with a third threshold; and a step size generation step of generating a step size which is to be used for this tap coefficient update based on the step size which has been used at the previous tap coefficient update, a comparison result in the first comparison step, a comparison result in the second comparison step, a comparison result in the third comparison step, the step size upper limit value and the step size lower limit value. Therefore, according to the twenty-sixth aspect, a waveform equalization control method which has a follow-up property in the case where the transmission line distortion of the input signal is varied and a higher convergence speed at the initial operation, is hardly affected by noises, and has a higher stability at a low C/N time can be realized.

A waveform equalization control method according to a twenty-seventh aspect controls the updating of a tap coefficient of a filter which is included in a waveform equalizer for reducing a transmission line distortion of an input signal based on a LMS algorithm. The waveform equalization control method of the twenty-seventh aspect comprises: a step of estimating an error of an output signal of the waveform equalizer from the output signal, and generating an error signal; a step of judging whether a probability of a judgement error in the error estimation for the output signal is larger or smaller, and generating a judgement signal; a step of deciding a step size, which is a step for updating the tap coefficient, based on the judgement signal; and a step of calculating a tap coefficient updating amount based on the error signal, the step size, and a data to be used for the tap coefficient update. Therefore, the step size can be increased according the probability of the judgement error for the output signal, and as a result, according to the twenty-seventh aspect, a waveform equalization control method which has a follow-up property in the case where the transmission line distortion of the input signal is varied and a higher convergence speed at the initial operation can be realized.

A waveform equalization control method according to a twenty-eight aspect of the present invention controls the updating of a tap coefficient of a filter which included in a waveform equalizer for reducing a transmission line distortion of an input signal based on a LMS algorithm. The waveform equalization control method of the twenty-eighth aspect comprises: an error estimation step of estimating an error of the output signal of the waveform equalizer from the output signal, and generating an error signal; a step size decision step of deciding a step size as a step for updating the tap coefficient based on the error signal, a threshold and plural step size set values; and a coefficient updating amount calculation step of calculating a tap coefficient updating amount based on the error signal, the step size and a data to be used for the tap coefficient update. Therefore, one of the step sizes can be selected according to the relationship between the error signal and the threshold, and as a result, according to the twenty-eighth aspect, a waveform equalization control method which has a follow-up property in the case where the transmission line distortion of the input signal is varied and a higher convergence speed at the initial operation can be realized.

According to a twenty-ninth aspect of the present invention, in accordance with the waveform equalization control method of the twenty-eighth aspect, the plural step size set values are a first step size set value and a second step size set value which is larger than the first step size set value. Further, the step size decision step comprises: a comparison step of comparing an absolute value of the error signal with the threshold; and a selection step of selecting one of the first step size set value and the second step size set value as the step size based on a comparison result in the comparison step. Therefore, one of the step sizes can be selected based on the result of the comparison between the error signal and the threshold, and as a result, according to the twenty-ninth aspect, a waveform equalization control method which has a follow-up property in the case where the transmission line distortion of the input signal is varied and a higher convergence speed at the initial operation can be realized.

A waveform equalization control method according to a thirtieth aspect of the present invention controls the updating of a tap coefficient of a filter which is included in a waveform equalizer for reducing a transmission line distortion of an input signal based on a LMS algorithm. The waveform equalization control method of the thirtieth aspect comprises: an error estimation step of estimating an error of an output signal of the waveform equalizer from the output signal, and generating an error signal which is obtained by making the estimated error 0 when the estimated error is an error corresponding to a predetermined range of the output signal; a coefficient update timing control step of generating an update timing signal which controls a timing of calculating the tap coefficient updating amount at intervals of plural symbols based on the error signal; and a coefficient updating amount calculation step of calculating a tap coefficient updating amount at the timing controlled by the update timing signal based on the error signal, a step size as a step for updating the tap coefficient, and a data to be used for the tap coefficient update. Therefore, the tap coefficient updating amount is calculated in the coefficient updating amount calculation step when the error signal is not "0", and as a result the coefficient updating interval can be reduced with regard to the waveform equalization control method for performing the coefficient update at a predetermined symbol intervals. Thus, according to the thirtieth aspect, a waveform equalization control method which has a follow-up property in the case where the transmission line distortion of the input signal is varied and a higher convergence speed at the initial operation can be realized.

According to a thirty-first aspect of the present invention, in accordance with the waveform equalization control method of the thirtieth aspect, the update timing signal is generated for controlling the timing of calculating the tap coefficient updating amount in the coefficient update timing control step to be at a first symbol after an interval of predetermined symbols or more from a previous timing and when the error signal is not 0. Therefore, the coefficient updating interval can be reduced with regard to the waveform equalization control method for performing the coefficient update at previously determined symbol intervals. Thus, according to the thirty-first aspect, a waveform equalization control method which has a follow-up property in the case where the transmission line distortion of the input signal is varied and a higher convergence speed at the initial operation can be realized.

A waveform equalization control method according to a thirty-second aspect controls the updating of a tap coefficient of a filter which is included in a waveform equalizer for reducing a transmission line distortion of an input signal based on a LMS algorithm. The waveform equalization control method of the thirty-second aspect comprises: a step of estimating an output error from an output signal of the waveform equalizer and generating an output error signal; a step of generating an error signal which is obtained by reducing a partial section of the output error signal at a predetermined rate based on the output error signal and the output signal; and a step of calculating a tap coefficient updating amount based on the error signal, a step size as a step for updating the tap coefficient, and a data to be used for the tap coefficient update. Therefore, the output error signal which has been converted into "0" in the step of generating the coefficient updating error signal is converted into an error signal which is obtained by multiplying the output error signal by a predetermined rate so as to decrease the value. Thus, the error signal which can be used for the tap coefficient update is increased in number as compared to a Stop&Go algorithm. Therefore, according to the thirty-second aspect, a waveform equalization control method which has a follow-up property in the case where the transmission line distortion of the input signal is varied and a higher convergence speed at the initial operation can be realized.

A waveform equalization control method according to a thirty-third aspect controls the updating of a tap coefficient of a filter which is included in a waveform equalizer for reducing a transmission line distortion of an input signal based on a LMS algorithm. The wavelength equalization control method of the thirty-third aspect comprises: an output error estimation step of estimating an output error from an output signal of the waveform equalizer, and generating an output error signal; an error rate signal generation step of generating an error rate signal which indicates a rate of an error that is included in the output signal of the waveform equalizer; a coefficient updating error generation step of generating an error signal to be used for updating the tap coefficient based on the output error signal, the output signal and the error rate signal; and a coefficient updating amount calculation step of calculating a tap coefficient updating amount based on the error signal, a step size as a step for the update of the tap coefficient and a data to be used for the tap coefficient update. Therefore, the update interval of the tap coefficient is reduced, and further, the error signal which can be used for the tap coefficient update is increased in number. Thus, according to the thirty-third aspect, a waveform equalization control method which has a follow-up property in the case where the transmission line distortion of the input signal is varied and a higher convergence speed at the initial operation can be realized.

According to a thirty-fourth aspect of the present invention, in accordance with the waveform equalization control method of the thirty-third aspect, when it is detected from the error rate signal in the coefficient updating error generation step that the rate of the error that is included in the output signal is smaller than a predetermined rate, the same value as the output error signal is generated as the error signal. Therefore, the update interval of the tap coefficient is reduced, and further, the error signal which can be used for the tap coefficient update is increased in number. Thus, according to the thirty-fourth aspect, a waveform equalization control method which has a follow-up property in the case where the transmission line distortion of the input signal is varied and a higher convergence speed at the initial operation can be realized.

BRIEF DESCRIPTION OF THE DRAWINGS

FIG. 15 is a block diagram illustrating a structure of a waveform equalization controller according to an eighth embodiment of the present invention.

FIGS. 16(a)–16(b) are diagrams for explaining the operation of the waveform equalization controller according to the eighth embodiment of the present invention.

FIGS. 18(a)–18(b) are diagrams for explaining the operation of the waveform equalization controller according to the ninth embodiment of the present invention.

FIG. 19 is a block diagram illustrating a structure of a prior art waveform equalization controller.

FIGS. 22(a)–22(b) are diagrams for explaining the operation of the prior art waveform equalization controller.

DETAILED DESCRIPTION OF INVENTION

Hereinafter, a waveform equalization controller and a waveform equalization control method according to embodiments of the present invention will be described with reference to the drawings.

First Embodiment

A waveform equalization controller and a waveform equalization control method according to the first embodiment of the present invention will now be described with reference to the drawings.

Figure 1:
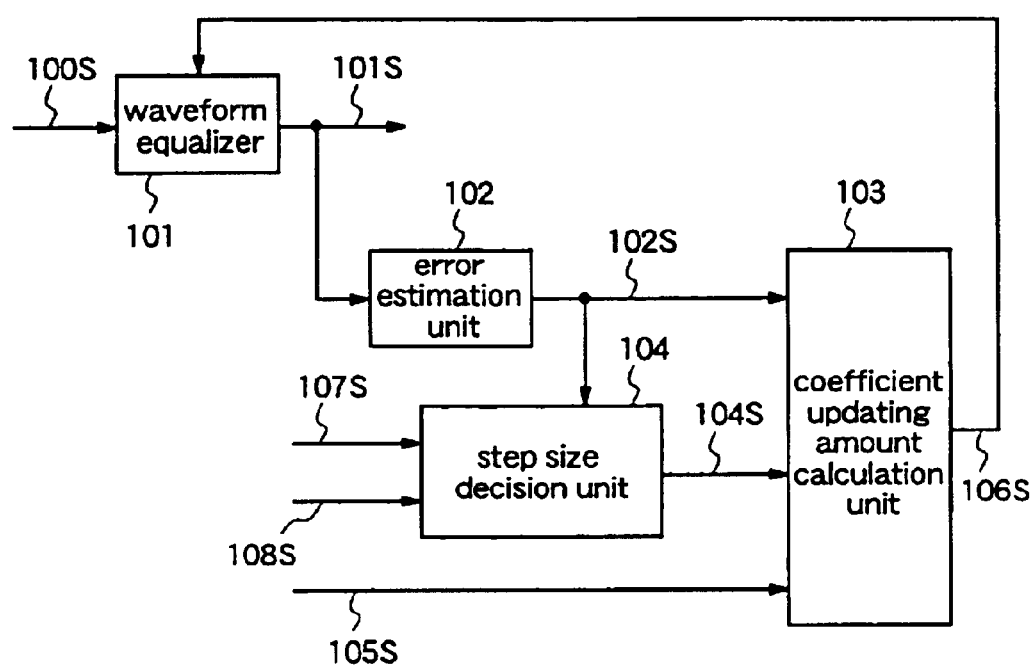
FIG. 1 is a block diagram illustrating a structure of a waveform equalization controller according to a first embodiment of the present invention.

FIG. 1 is a block diagram illustrating a structure of the waveform equalization controller according to the first embodiment. In FIG. 1, the waveform equalization controller of the first embodiment comprises: a waveform equalizer 101 for outputting an output signal 101S which is obtained by reducing the transmission line distortion of an input signal 100S based on the LMS algorithm; an error estimation unit 102 for estimating the error of the output signal 101S and outputting an error signal 102S; a coefficient updating amount calculation unit 103 for calculating a tap coefficient updating amount 106S based on the error signal 102S, a step size 104S and a coefficient updating data 105S to be used for coefficient update; and a step size decision unit 104 for receiving the error signal 102S, a step size upper limit value 107S and a step size lower limit value 108S, and generating and outputting the step size 104S.

Figure 2:
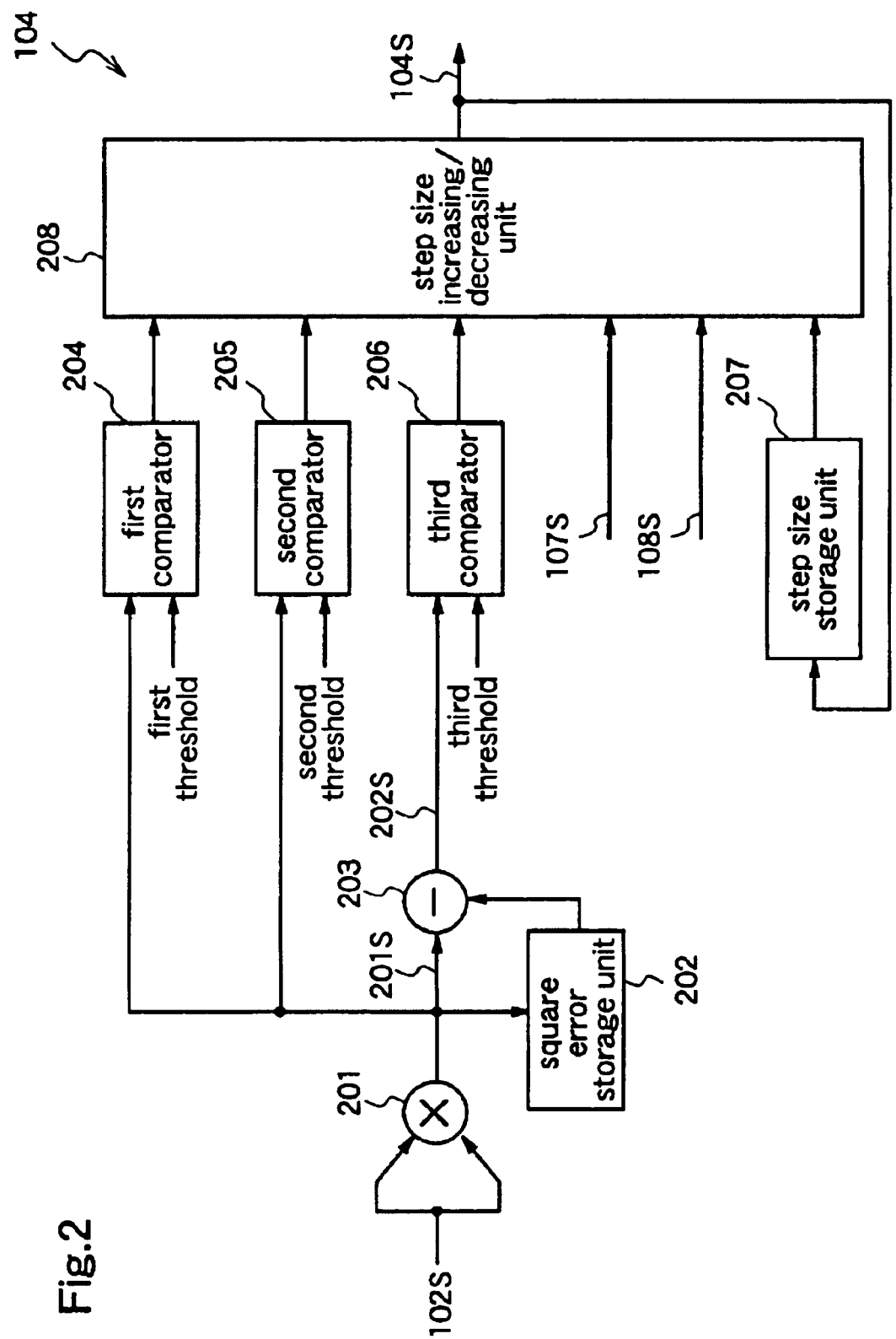
FIG. 2 is a block diagram illustrating a structure of a step size decision unit according to the first embodiment.

FIG. 2 is a block diagram illustrating a structure of the step size decision unit 104 which is included in the waveform equalization controller of the first embodiment. In FIG. 2, the step size decision unit 104 comprises a multiplier 201 for squaring the error signal 102S and generating a square error 201S, a square error storage unit 202 for containing (storing) the square error 201S, a subtracter 203 for calculating the difference between the square error 201S that is outputted from the multiplier 201 and the square error that is stored in the square error storage unit 202 and outputting the difference 202S between these square errors, a first comparator 204 for comparing the square error 201S with a first threshold, a second comparator 205 for comparing the square error 201S with a second threshold, a third comparator 206 for comparing the absolute value of the difference 202S between the square errors with a third threshold, a step size storage unit 207 for containing the step size, and a step size increasing/decreasing unit 208.

The operation of the waveform equalization controller according to the first embodiment will now be described with reference to the drawings.

Figure 23:
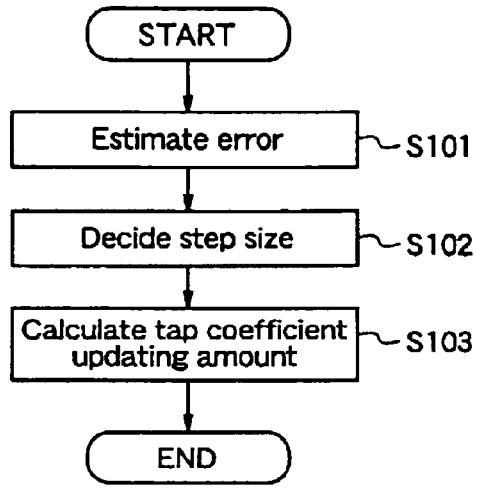
FIG. 23 is a flowchart showing the operation of the waveform equalization controller according to the first embodiment.

FIG. 23 is a flowchart showing the operation of the waveform equalization controller according to the first embodiment.

Initially, a signal from the transmission line is input to the waveform equalizer 101 as the input signal 100S via a tuner and a wave detector (not shown). The error estimation unit 102 estimates an error to be used for the tap coefficient update based on the output signal 101S that is outputted from the waveform equalizer 101, generates the error signal 102S based on the estimated error, and outputs the error signal 102S (step S101). Similar to the output error estimation unit 1502 of the prior art, when the output signal 101S takes on only one value, the error estimation unit 102 estimates the difference between the output signal 101S and the ideal value of the error of the output signal 101S as the error, generates the error signal 102S corresponding to the size of the error, and outputs the error signal 102S. On the other hand, when the output signal 101S takes on multiple values, the error estimation unit 102 estimates the difference between the output signal 101S and an ideal value which is nearest to the output signal 101S among their multiple ideal values as the error, generates the error signal 102S corresponding to the size of the error, and outputs the error signal 102S. In this first embodiment, the input signal 100S is not limited to the DTV signal.

The step size decision unit 104 receives the error signal 102S, the step size upper limit value 107S as a value for deciding the upper limit of the step size and the step size lower limit value 108S as a value for deciding the lower limit of the step size, decides the step size 104S, the value of which is varied according to the error signal 102S within a range of the step size lower limit value 108S or larger and the step size upper limit value 107S or smaller, and outputs the step size 104S (step S102). The coefficient updating amount calculation unit 103 receives the error signal 102S, the step size 104S and the coefficient updating data 105S, performs the multiplication of these as shown in the second term on the right side in the above mentioned (Expression 1), and outputs the tap coefficient updating amount 106S (step S103). Then, the tap coefficient updating amount 106S is used in the waveform equalizer 101 to update the tap coefficient shown by (Expression 1). Here, the processes of steps S101 to S103 and the updating of the tap coefficient in the waveform equalizer 101 are repeated as long as the waveform equalization is performed in the waveform equalizer 101.

As the coefficient updating data 105S used for the coefficient update, data which are stored in a data FIFO (not shown) that is included in the waveform equalizer 101 are employed. The waveform equalization controller of the first embodiment can separately comprise a FIFO for containing the coefficient updating data 105S. Further, as the upper limit value 107S of the step size and the lower limit value 108S of the step size, values which have previously been stored in a register (not shown) that is included in the waveform equalization controller of the first embodiment are employed.

The operation of the step size decision unit 104 will now be described.

Figure 24:
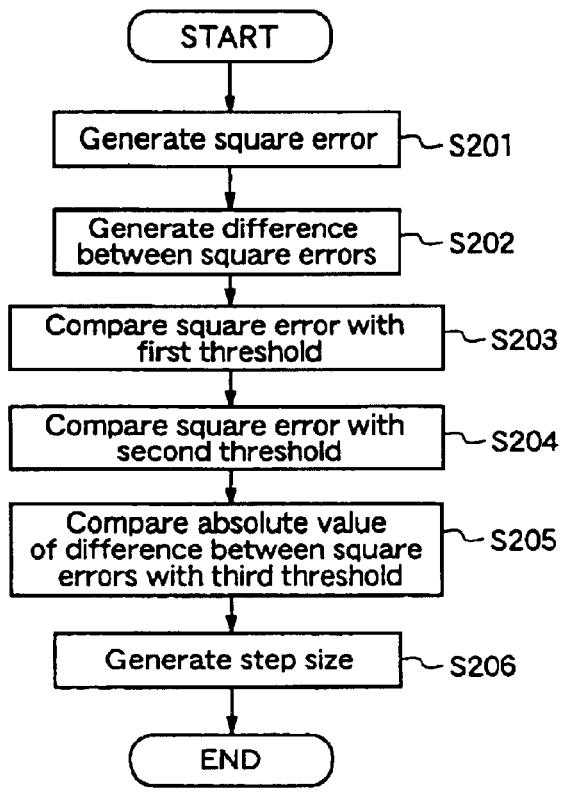
FIG. 24 is a flowchart showing the operation of the waveform equalization controller according to the first embodiment.

FIG. 24 is a flowshart showing the operation of the step size decision unit 104 of the first embodiment.

The multiplier 201 squares the error signal 102S so as to generate the square error 201S (step S201). The square error storage unit 202 contains (stores) the square error at the previous coefficient updating. The subtracter 203 calculates the difference between the square error 201S and the square error at the previous coefficient updating, and outputs the difference 202S between the square errors (step S202). Then, the square error storage unit 202 contains the present square error 201S. The first comparator 204 compares the square error 201S with the first threshold (step S203). The second comparator 205 compares the square error 201S with the second threshold (step S204). The third comparator 206 compares the absolute value of the difference 202S between the square errors with the third threshold (step S205). The comparison result of the first comparator 204, the comparison result of the second comparator 205, the comparison result of the third comparator 206, the step size at the previous coefficient updating that is stored in the step size storage unit 207, the step size upper limit value 107S, and the step size lower limit value 108S are inputted to the step size increasing/decreasing unit 208.

When the square error 201S is larger than the second threshold, the waveform equalization operation for reducing the transmission line distortion in the waveform equalizer 101 is in an uncontrollable state, i.e., trending toward divergence. On the other hand, when the square error 201S is smaller than the first threshold, the waveform equalization operation in the waveform equalizer 101 is either converging or has converged. When the square error 201S is smaller than the first threshold and when the absolute value of the difference 202S between the square errors is larger than the third threshold, the waveform equalization operation in the waveform equalizer 101 is converging. When the absolute value of the difference 202S between the square errors is equal to or smaller than the third threshold, the waveform equalization operation in the waveform equalizer 101 has converged.

Practically, rough values of the first to third thresholds are set by simulation, and then the first to third thresholds are finally set based on the judgement of the designer which is made by considering the result of the actual operation, respectively.

To be specific, the second threshold is set to such a value that the designer judges that when the square error 201S is larger than the value of the second threshold, the waveform equalization operation in the waveform equalizer 101 is trending toward divergence. The first threshold is set to such a value that the designer judges that when the square error 201S is smaller than the value of the first threshold, the waveform equalization operation in the waveform equalizer 101 is either converging or has converged. The third threshold is set to such a value that the designer judges that when the square error 201S is smaller than the first threshold and when the absolute value of the difference 202S between the square errors is larger than the value of third threshold, the waveform equalization operation in the waveform equalizer 101 is converging, and when the absolute value of the difference 202S between the square errors is equal to or smaller than the third threshold, the waveform equalization operation in the waveform equalizer 101 has converged.

The operation of the step size increasing/decreasing unit 208 will now be described with reference to the drawings.

Figure 3:
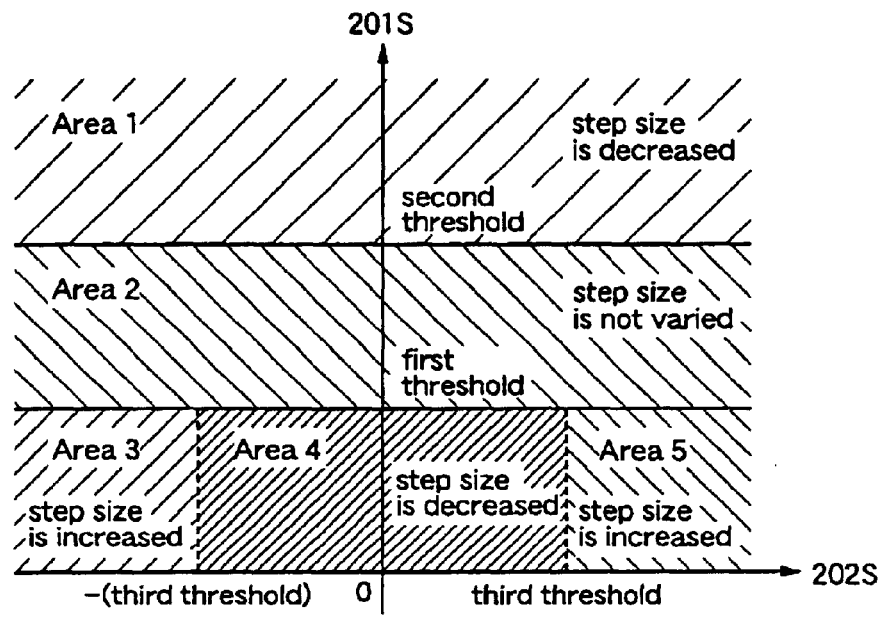
FIG. 3 is a diagram for explaining the operation of a step size increasing/decreasing unit according to the first embodiment.

FIG. 3 is a diagram for explaining the operation of the step size increasing/decreasing unit 208 in the waveform equalization controller according to the first embodiment.

In FIG. 3, when the square error 201S is within an area 1, i.e., when it is judged by the second comparator 205 that the square error 201S is larger than the second threshold, it is judged that the waveform equalizer 101 is trending to divergence. Therefore, the step size increasing/decreasing unit 208 obtains a new step size which is obtained by decreasing the previous step size that is stored in the step size storage unit 207 by a prescribed amount.

When the square error 201S is within an area 2, i.e., it is judged by the first comparator 204 and the second comparator 205 that the square error 201S is the first threshold or larger and the second threshold or smaller, it is judged that the waveform equalizer 101 is operating stably. Therefore, the step size increasing/decreasing unit 208 takes the same step size as the previous step size that is stored in the step size storage unit 207 as a new step size.

When the square error 201S and the difference 202S between the square errors are within an area 3 or area 5, i.e., it is judged by the first comparator 204 that the square error 201S is smaller than the first threshold and it is judged by the third comparator 206 that the absolute value of the difference 202S between the square errors is larger than the third threshold value, the waveform equalizer 101 is judged to be converging. Therefore, the step size increasing/decreasing unit 208 obtains a new step size which is obtained by increasing the previous step size that is stored in the step size storage unit 207 by a prescribed amount so as to increase the convergence speed more. Here, the step size is increased in the area 5 to also suitably cope with dynamic ghost, i.e., ghost varying with time.

When the square error 201S and the difference 202S between the square errors are within an area 4, i.e., it is judged by the first comparator 204 and the third comparator 206 that the square error 201S is smaller than the first threshold and the absolute value of the difference 202S between the square errors is equal to or smaller than the third threshold, the waveform equalizer 101 is judged to have almost converged. Therefore, the step size increasing/decreasing unit 208 obtains a new step size which is obtained by decreasing the previous step size that is stored in the step size storage unit 207 by a prescribed amount so as to ensure the stability at the low C/N time.

Further, when the new step size is larger than the step size upper limit value 107S, the step size increasing/decreasing unit 208 outputs the step size upper limit value 107S as the step size 104S. When the new step size is smaller than the step size lower limit value 108S, the step size increasing/decreasing unit 208 outputs the step size lower limit value 108S as the step size 104S. In other cases, the new step size is output as the step size 104S (step S206).

As described above, according to the waveform equalization controller of the first embodiment, the step size decision unit 104 is provided so as to judge the status of the waveform equalizer 101 from the square error 201S and the difference 202S between the square errors, and obtains the suitable step size 104S by correspondingly increasing or decreasing previous step size. Thus, the waveform equalization controller having a higher convergence speed and a higher stability at the low C/N time can be realized.

In this first embodiment, the square error is used as the index for increasing or decreasing the step size. However, the index for increasing or decreasing the step size is not limited to the square error. The same function can also be attained with the n-th power of the error (where "n" is 1 or an integer of 3 or more). In this case, when "n" is an odd number, the absolute value of the n-th power of the error is used, for example, in the first comparator 204 or the second comparator 205 as the n-th power error.

Further, in this first embodiment, when the step size increasing/decreasing unit 208 increases/decreases the step size, a prescribed amount is added/subtracted to/from the previous step size. However, the operation in the present invention of increasing/decreasing the step size is not limited thereto. The step size can be increased/decreased by increasing/decreasing the previous step size by a prescribed ratio. To be specific, when the step size is to be increased, the previous step size is multiplied by a prescribed value which is larger than 1, for example 1.1. When the step size is to be decreased, the previous step size is multiplied by a prescribed value which is smaller than 1, for example 0.9.

Second Embodiment

A waveform equalization controller according to the second embodiment of the present invention will now be described with reference to the drawings.

Figure 4:
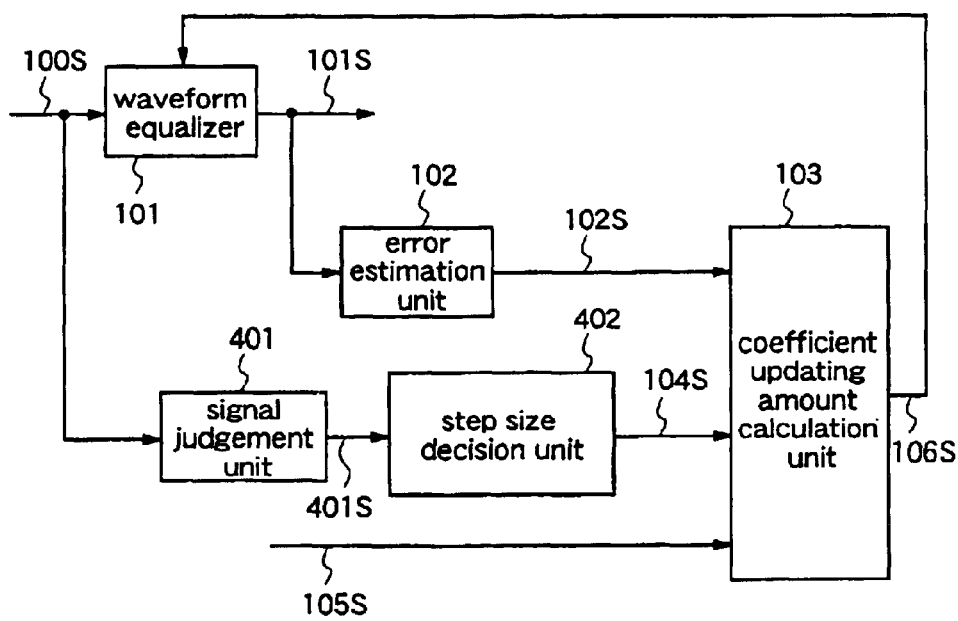
FIG. 4 is a block diagram illustrating a waveform equalization controller according to a second embodiment of the present invention.

FIG. 4 is a block diagram illustrating a structure of the waveform equalization controller according to the second embodiment. In FIG. 4, the waveform equalization controller of the second embodiment comprises: a waveform equalizer 101 for outputting an output signal 101S which is obtained by reducing the transmission line distortion of an input signal 100S based on the LMS algorithm; an error estimation unit 102 for estimating the error of the output signal 101S and outputting an error signal 102S; a coefficient updating amount calculation unit 103 for calculating a tap coefficient updating amount 106S based on the error signal 102S, a step size 104S and a coefficient updating data 105S to be used for the coefficient update; a signal judgement unit 401 for outputting a judgement signal 401S; and a step size decision unit 402 for outputting the step size 104S in accordance with the judgement signal 401S.

The operation of the waveform equalization controller according to the second embodiment will now be described with reference to the drawings.

Figure 25:
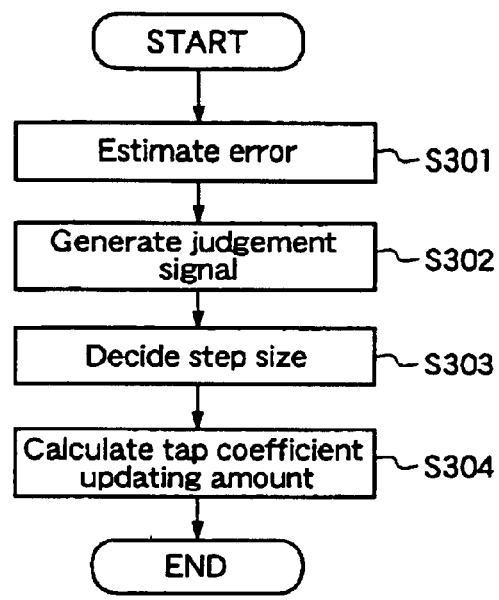
FIG. 25 is a flowchart showing the operation of the waveform equalization controller according to the second embodiment.

FIG. 25 is a flowchart showing the operation of the waveform equalization controller according to the second embodiment.

The error estimation unit 102 estimates the error to be used for the tap coefficient update from the output signal 101S, generates the error signal 102S based on the estimated error, and outputs the error signal 102S (step S301). The signal judgement unit 401 judges the kind of the contents of the output signal 101S from the synchronous signal that is included in the input signal 100S, generates whether the probability of a judgement error in the error which is estimated by the error estimation unit 102 for the output signal 101S is higher or lower as the judgement signal 401S, and outputs the judgement signal 401S (step S302).

Figure 5:
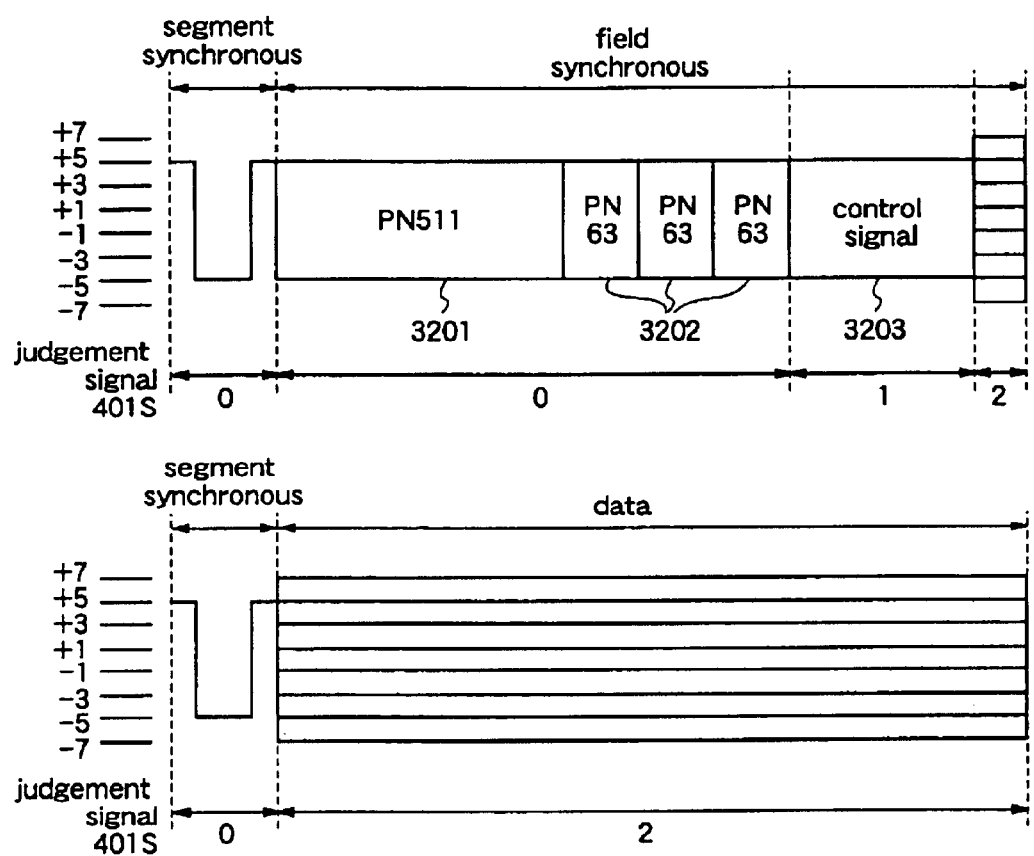
FIG. 5 is a diagram showing the relationship between a judgement signal and an output signal of the waveform equalization controller according to the second embodiment.
Figure 20:
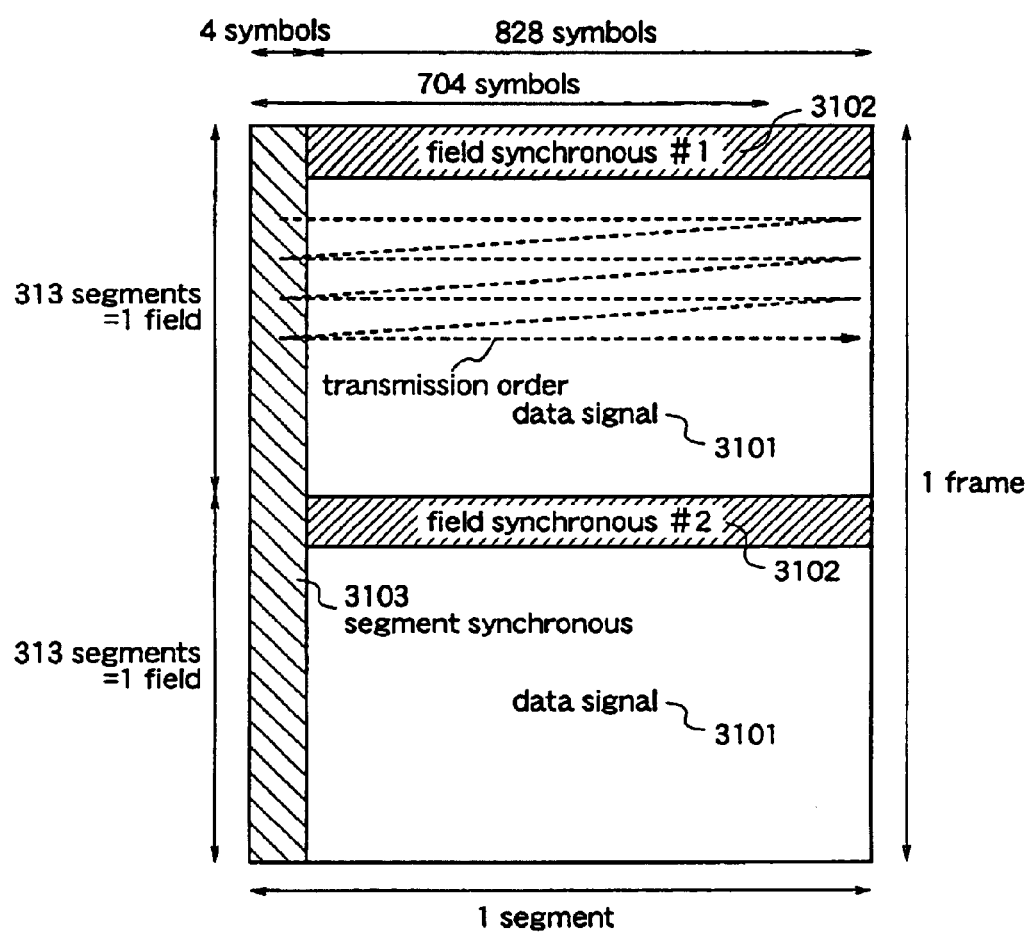
FIG. 20 is a diagram illustrating a structure of a DTV signal format.
Figure 21:
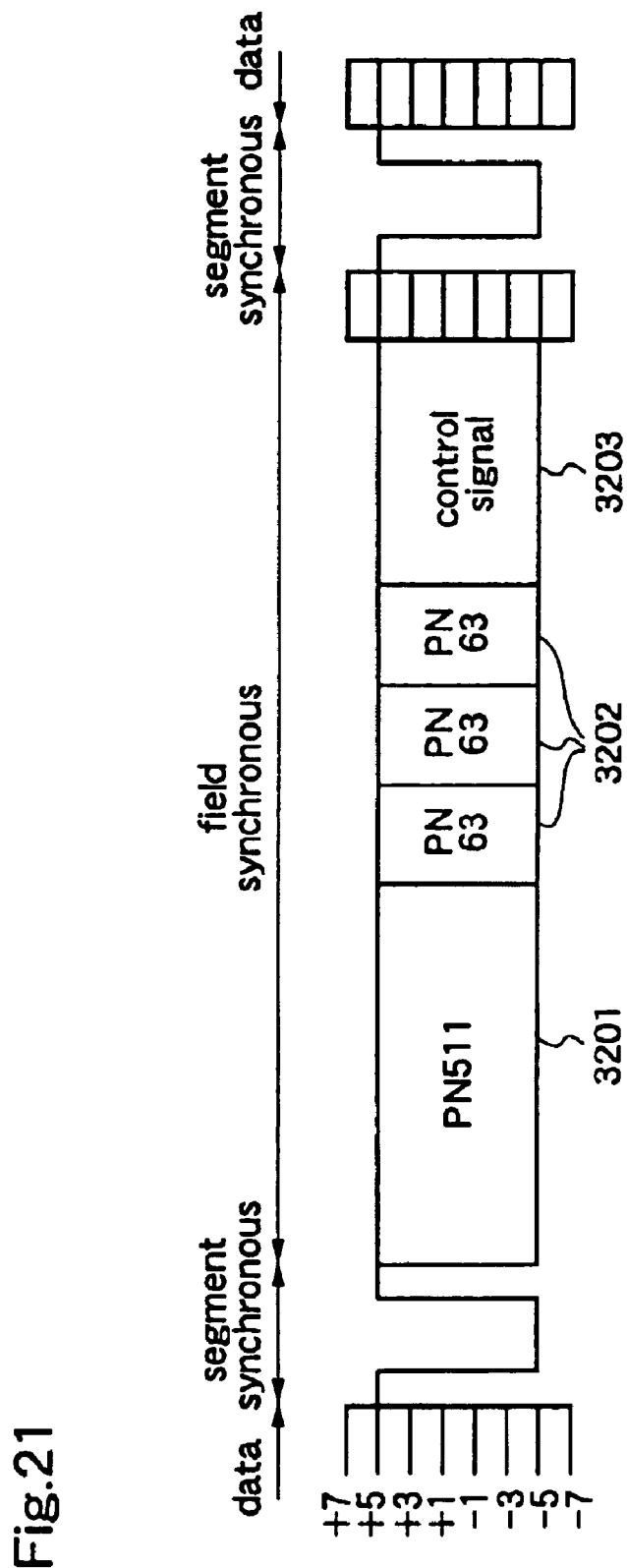
FIG. 21 is a diagram illustrating a structure of a field synchronous signal format in the DTV signal.

Hereinafter, a description is provided by using a case, as an example, where the input to the waveform equalizer 101 is a DTV signal. FIG. 5 shows the relationship between the judgement signal 401S and the output signal 101S. In FIGS. 20 and 21, the symbol values of the segment synchronous signal 3103, and the PN511 signal 3201 and the PN63 signal 3202 in the field synchronous signal 3102 are previously known. Therefore, no judgement error occurs in the error which is estimated by the error estimation unit 102 for the output signal 101S. In this case, the error signal 102S always shows a correct value. Therefore, the signal judgement unit 401 outputs "0" as the judgement signal 401S. The control signal 3203 can take on only two values from among eight values of the DTV signal. Therefore, the probability of the judgement error in the error which is estimated by the error estimation unit 102 for the output signal 101S is low. In this case, the error signal 102S shows a nearly correct value. Therefore, the signal judgement unit 401 outputs "1" as the judgement signal 401S. Other signals can take on all of the eight values among the eight values of the DTV signal. Thus, the probability of the judgement error in the error which is estimated by the error estimation unit 102 for the output signal 101S is high. Since the probability of the error signal 102S showing a correct value is low in this case, the signal judgement unit 401 outputs "2" as the judgement signal 401S.

The step size decision unit 402 selects one of three kinds of step sizes which have previously been set according to the values of the judgement signal 401S, and outputs the selected step size 104S. When the judgement signal 401S is "0", the largest step size is output as the step size 104S. When the judgement signal 401S is "1", the second largest step size is output as the step size 104S. When the judgement signal 401S is "2", the smallest step size is output as the step size 104S (step S303). The coefficient updating amount calculation unit 103 receives the error signal 102S, the step size 104S and the coefficient updating data 105S, performs the multiplication of these as shown in the second term on the right side in the above-mentioned (Expression 1), and outputs the tap coefficient updating amount 106S (step S304). Then, the tap coefficient updating amount 106S is used in the waveform equalizer 101 to update the tap coefficient shown by (Expression 1). Here, the processes of steps S301 to S304 and the updating of the tap coefficient in the waveform equalizer 101 are repeated as long as the waveform equalization is performed in the waveform equalizer 101.

As described above, according to the waveform equalization controller of the second embodiment, the signal judgement unit 401 for outputting the judgement signal 401S according to the probability of the judgement error in the error by the error estimation unit 102 with regard to the output signal 101S, and the step size decision unit 402 for outputting one of the step sizes which have previously been set according to the judgement signal 401S are provided. Therefore, the value of the step size 104S can be changed according to the probability of the judgement error in the error estimation for the output signal 101S. When the error signal 102S is correct, the tap coefficient updating amount 106S is increased. Therefore, the convergence speed can be increased, and as a result, a waveform equalization controller having a higher convergence speed and a higher stability at the low C/N time can be realized.

In this second embodiment, a description was given of a case where the input signal 100S is the DTV signal. However, the input signal 100S is not limited to the DTV signal. In addition, while the judgement signal 401S is set to have three levels, the judgment signal 401S is not limited to the three levels and can be set instead to have two levels, or four or more levels. Further, the signal value of the judgement signal 401S is not limited to "0", "1" and "2". Furthermore, the step size 104S to be selected is not limited to three kinds and can instead have two kinds, or four or more kinds.

Further, in this second embodiment, a description was given of a case where the signal judgement unit 401 generates the judgement signal 401S by using the synchronous signal that is included in the input signal 100S. However, the signal judgement unit 401 can generate the judgement signal 401S by using the synchronous signal that is included in the output signal 101S.

Third Embodiment

A waveform equalization controller according to the third embodiment of the present invention will now be described with reference to the drawings.

Figure 6:
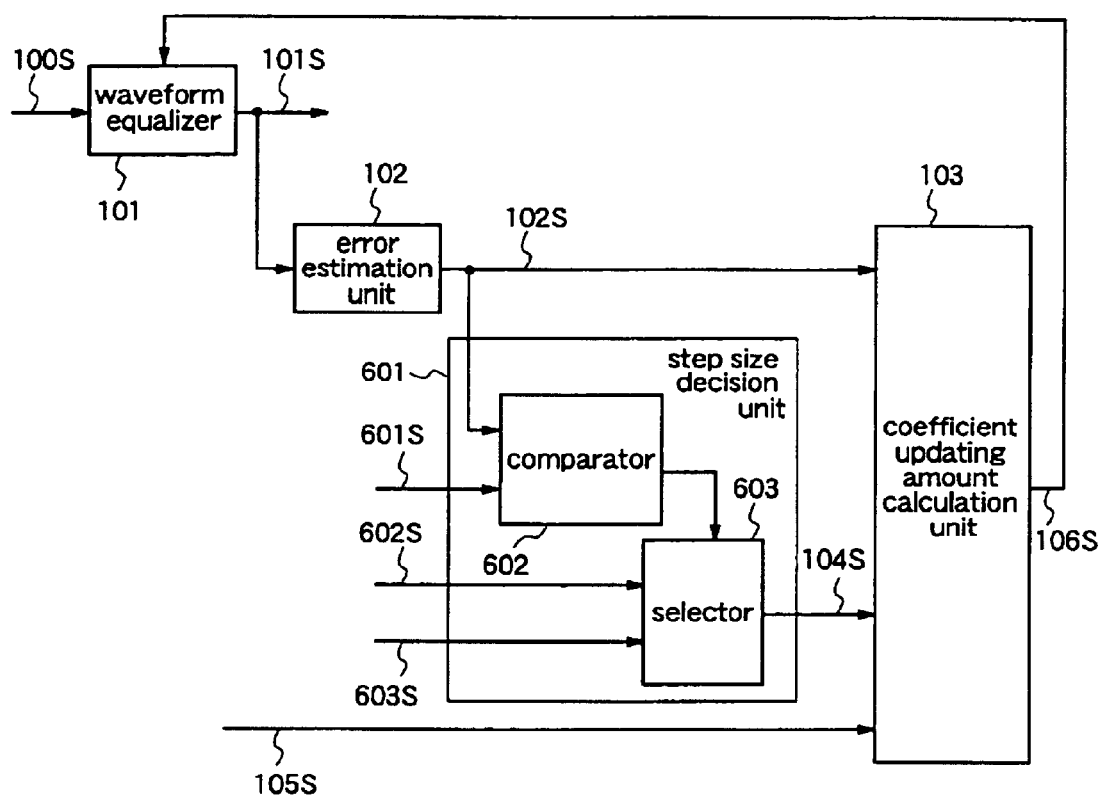
FIG. 6 is a block diagram illustrating a structure of a waveform equalization controller according to a third embodiment of the present invention.

FIG. 6 is a block diagram illustrating a structure of the waveform equalization controller according to the third embodiment. In FIG. 6, the waveform equalization controller of the third embodiment comprises: a waveform equalizer 101 for outputting an output signal 101S which is obtained by reducing the transmission line distortion of an input signal 100S based on the LMS algorithm; an error estimation unit 102 for estimating the error of the output signal 101S and outputting an error signal 102S; a coefficient updating amount calculation unit 103 for calculating a tap coefficient updating amount 106S based on the error signal 102S, a step size 104S and a coefficient updating data 1005S to be used for the coefficient update; and a step size decision unit 601 for receiving the error signal 102S, a threshold 601S, a first step size set value 602S and a second step size set value 603S, and generating and outputting the step size 104S. The step size decision unit 601 comprises a comparator 602 and a selector 603.

The operation of the waveform equalization controller according to the third embodiment will now be described with reference to the drawings.

Figure 26:
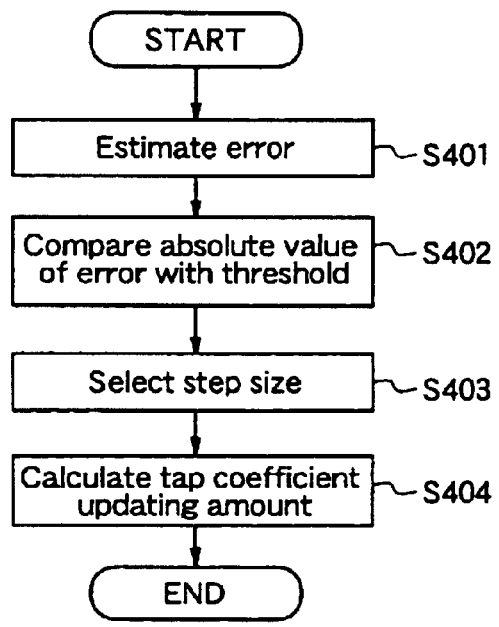
FIG. 26 is a flowchart showing the operation of the waveform equalization controller according to the third embodiment.

FIG. 26 is a flowchart showing the operation of the waveform equalization controller according to the third embodiment.

The error estimation unit 102 estimates the error based on the output signal 101S that is outputted from the waveform equalizer 101 to be used for the tap coefficient update, and outputs the estimated error as the error signal 102S (step S401). The comparator 602 compares the absolute value of the error signal 102S with the threshold 601S (step S402). From the comparison result of the comparator 602, when the absolute value of the error signal 102S is equal to or smaller than the threshold 601S, the selector 603 selects the first step size set value 602S and outputs the first step size set value 602S as the step size 104S. From the comparison result of the comparator 602, when the absolute value of the error signal 102S exceeds the threshold 601S, the selector 603 selects the second step size set value 603S which is a step size larger than the first step size set value 602S, and outputs the second step size set value 603S as the step size 104S (step S403). In this way, in steps S402 and S403, the step size 104S is decided based on the error signal 102S, the threshold 601S, the first step size set value 602S and the second step size set value 603S. The coefficient updating amount calculation unit 103 receives the error signal 102S, the step size 104S and the coefficient updating data 105S, performs the multiplication of these as shown in the second term on the right side of the above-mentioned (Expression 1), and outputs the tap coefficient updating amount 106S (step S404). Then, the tap coefficient updating amount 106S is used in the waveform equalizer 101 to update the tap coefficient shown by (Expression 1). Here, the processes of steps S401 to S404 and the updating of the tap coefficient in the waveform equalizer 101 are repeated as long as the waveform equalization is performed in the waveform equalizer 101.

The threshold 601S is set to have such a value that when the absolute value of the error signal 102S is equal to or smaller than the threshold value 601S, the waveform equalizer 101 has almost converged.

As described above, according to the waveform equalization controller of the third embodiment, the step size decision unit 601 is provided to change the magnitude of the step size 104S according to the magnitude of the error signal 102S. Therefore, in a stage where the error is large, i.e., the waveform equalizer 101 has not coverged yet, the large step size is employed to increase the convergence speed. In a stage where the error is small, i.e., the waveform equalizer 101 has almost converged, the small step size is employed so as to ensure the stability at the low C/N time. Accordingly, a waveform equalization controller having a higher convergence speed and a higher stability at the low C/N time can be realized.

In this third embodiment, the step size is changed at two levels. However, it is possible that plural thresholds are input to the comparator 602 and one of step sizes at three or more levels is selected by the selector 603 according to the comparison result.

Fourth Embodiment

A waveform equalization controller according to the fourth embodiment of the present invention will now be described with reference to the drawings.

Figure 7:
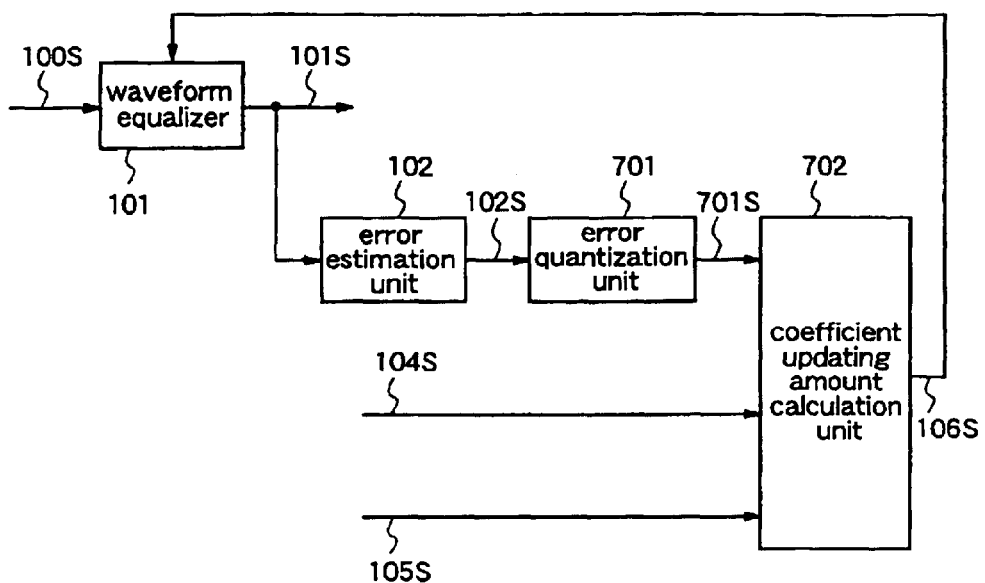
FIG. 7 is a block diagram illustrating a structure of a waveform equalization controller according to a fourth embodiment of the present invention.

FIG. 7 is a block diagram illustrating a structure of the waveform equalization controller according to the fourth embodiment. In FIG. 7, the waveform equalization controller of the fourth embodiment comprises: a waveform equalizer 101 for outputting an output signal 101S which is obtained by reducing a transmission line distortion of an input signal 100S based on the LMS algorithm; an error estimation unit 102 for estimating the error of the output signal 101S and outputting an error signal 102S; an error quantization unit 701 for converting the error signal 102S into a quantized error signal 701S having a value of the powers of 2 and outputting the quantized error signal 701S; and a coefficient updating amount calculation unit 702 for calculating a tap coefficient updating amount 106S based on the quantized error signal 701S, a step size 104S and a coefficient updating data 105S to be used for the coefficient update.

Figure 8:
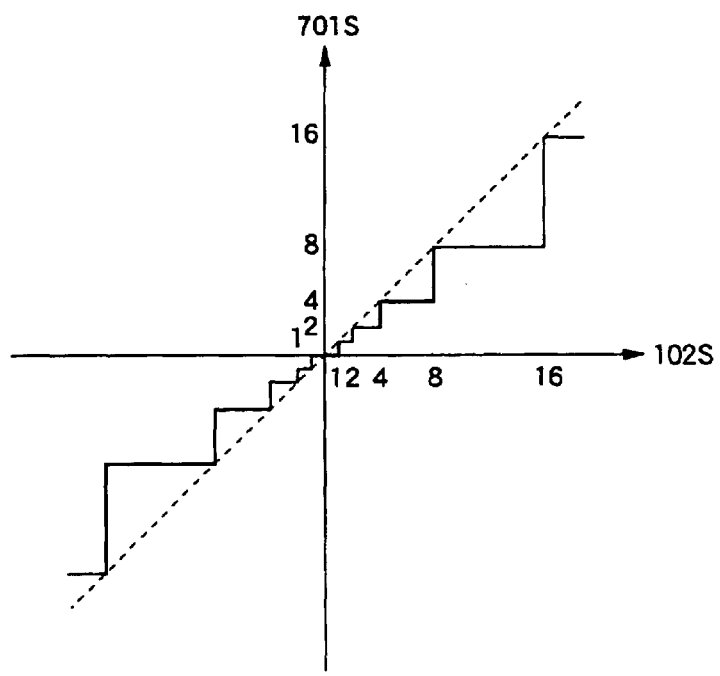
FIG. 8 is a diagram showing the relationship between an error signal and a quantized error signal of the waveform equalization controller according to the fourth embodiment.

The operation of the waveform equalization controller according to the fourth embodiment will now be described with reference to the drawings. The error estimation unit 102 estimates the error based on the output signal 101S that is outputted from the waveform equalizer 101 to be used for the tap coefficient update, and outputs the estimated error as the error signal 102S. The error quantization unit 701 converts the error signal 102S into the quantized error signal 701S having the same sign as the error signal 102S and the maximum absolute value which is equal to or smaller than the absolute value of the error signal 102S from among the powers of 2, and outputs the quantized error signal 701S. FIG. 8 shows the relationship between the error signal 102S and the quantized error signal 701S which is obtained by converting the error signal 102S. Here, assume that when the error signal 102S is "0", the quantized error signal 701S is also "0". The coefficient updating amount calculation unit 702 receives the quantized error signal 701S, the step size 104S and the coefficient updating data 105S. When the quantized error signal 701S taking on only the power of 2 or "0" is used, the process of multiplying the error can be replaced with the shift operation. Thus, the coefficient updating amount calculation unit 702 substitutes one multiplication and one shift operation for the process which is performed by the two-time multiplication in the prior art, and outputs the tap coefficient updating amount 106S.

As described above, according to the waveform equalization controller of the fourth embodiment, the error signal 102S is converted by the error quantization unit 701 into the quantized error signal 701S having a value of the powers of 2, and the tap coefficient updating amount 106S is obtained by using the quantized error signal 701S. Therefore, the multiplication can be replaced with the shift operation in the coefficient updating amount calculation unit 702. Accordingly, only one multiplier for calculating the coefficient updating amount of one tap is required, and therefore, the circuit scale can be reduced.

In this fourth embodiment, when the error signal 102S is to be converted into the quantized error signal 701S, the conversion as shown in FIG. 8 is performed. However, the error signal 102S can be converted into a quantized error signal 701S having the same sign as the error signal 102S and the minimum absolute value which is equal to or larger than the absolute value of the error signal 102S from among the powers of 2. Alternatively, the error signal 102S can be converted into a quantized error signal 701S having the same sign as the error signal 102S and the absolute value which is the nearest to the absolute value of the error signal 102S from among the powers of 2.

Fifth Embodiment

A waveform equalization controller according to the fifth embodiment of the present invention will now be described with reference to the drawings.

Figure 9:
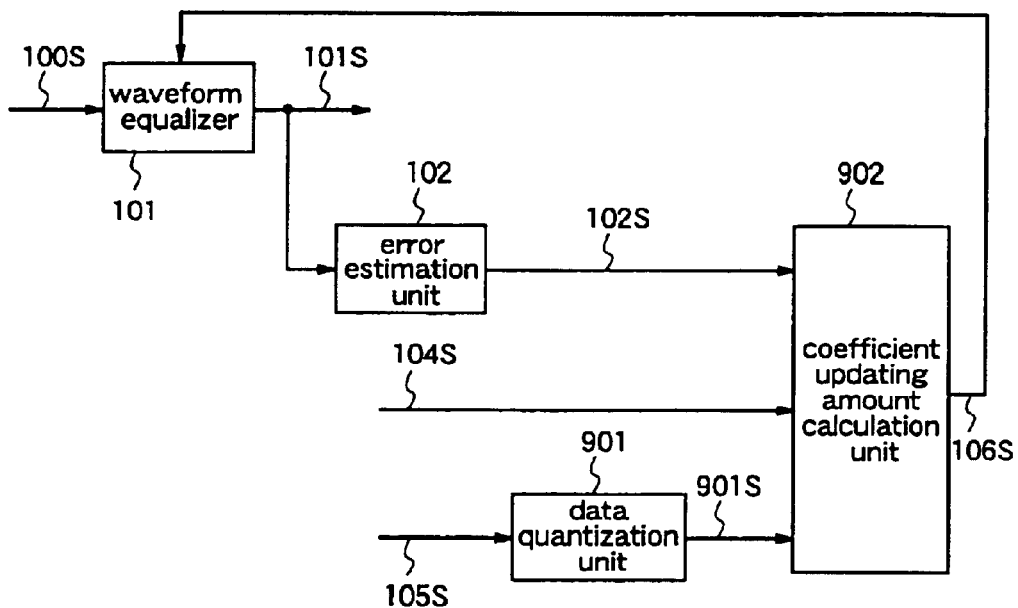
FIG. 9 is a block diagram illustrating a structure of a waveform equalization controller according to a fifth embodiment of the present invention.

FIG. 9 is a block diagram illustrating a structure of the waveform equalization controller according to the fifth embodiment. In FIG. 9, the waveform equalization controller of the fifth embodiment comprises: a waveform equalizer 101 for outputting an output signal 101S which is obtained by reducing the transmission line distortion of an input signal 100S based on the LMS algorithm; an error estimation unit 102 for estimating the error of the output signal 101S and outputting an error signal 102S, a data quantization unit 901 for converting a coefficient updating data 105S to be used for the coefficient update into a quantized data 901S having a value of the powers of 2 and outputting the quantized data 901S; and a coefficient updating amount calculation unit 902 for calculating a tap coefficient updating amount 106S based on the error signal 102S, a step size 104S and the quantized data 901S.

Figure 10:
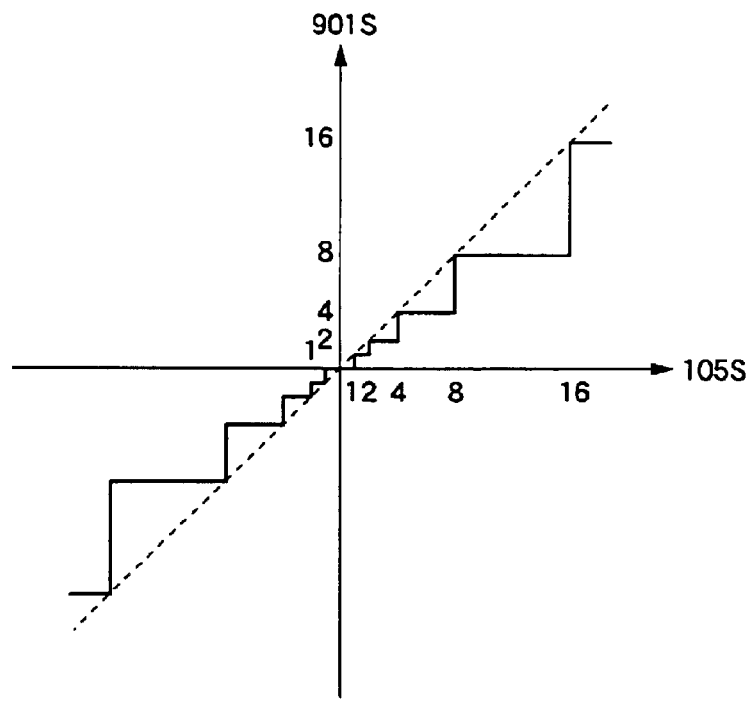
FIG. 10 is a diagram showing the relationship between a data and a quantized data of the waveform equalization controller according to the fifth embodiment.

The operation of the waveform equalization controller according to the fifth embodiment will now be described with reference to the drawings. The error estimation unit 102 estimates the error of the error of the output signal 101S based on the output signal 101S that is outputted from the waveform equalizer 101 to be used for the tap coefficient update, and outputs the estimated error as the error signal 102S. The data quantization unit 901 converts the coefficient updating data 105S into the quantized data 901S having the same sign as the coefficient updating data 105S and the maximum absolute value which is equal to or smaller than the coefficient updating data 105S among the powers of 2, and outputs the quantized data 901S. FIG. 10 shows the relationship between the coefficient updating data 105S and the quantized data 901S which is obtained by converting the coefficient updating data 105S and the quantized data 901S which is obtained by converting the data 105S. Here, assume that when the coefficient updating data 105S is "0", the quantized data 901S is also "0". The coefficient updating amount calculation unit 902 received the error signal 102S, the step size 104S and the quantized data 901S. When the quantized data 901S taking on only the powers of 2 or "0" is used, the process of multiplying the error can be replaced with the shift operation. Thus, the coefficient updating amount calculation unit 902 substitutes one multiplication and one shift operation for the process which is performed by the two-time multiplication in the prior art, and outputs the tap coefficient updating amount 106S.

As described above, according to the waveform equalization controller of the fifth embodiment, the coefficient updating data 105S to be used for the coefficient update is converted by the data quantization unit 901 into the quantized data 901S having a value of the powers of 2, and the tap coefficient updating amount 106S is obtained by using the quantizaed data 901S. Therefore, the multiplication can be replaced with the shift operation in the coefficient updating amount calculation unit 902. Accordingly, only one multiplier for calculating the coefficient updating amount of one tap is required, and as a result, the circuit scale can be reduced.

In this fifth embodiment, when the coefficient updating data 105S to be used for the coefficient update is to be converted into the quantized data 901S, the conversion as shown in FIG. 10 is performed. However, the coefficient updating data 105S can be converted into a quantized data 901S having the same sign as the coefficient updating data 105S and the minimum absolute value which is equal to or larger than the absolute value of the coefficient updating data 105S among the powers of 2. Alternatively, the coefficient updating data 105S can be converted into a quantized data 901S having the same sign as the coefficient updating data 105S and the absolute value which is nearest to the absolute value of the coefficient updating data 105S among the powers of 2.

Sixth Embodiment

A waveform equalization controller according to the sixth embodiment of the present invention will now be described with reference to the drawings.

Figure 11:
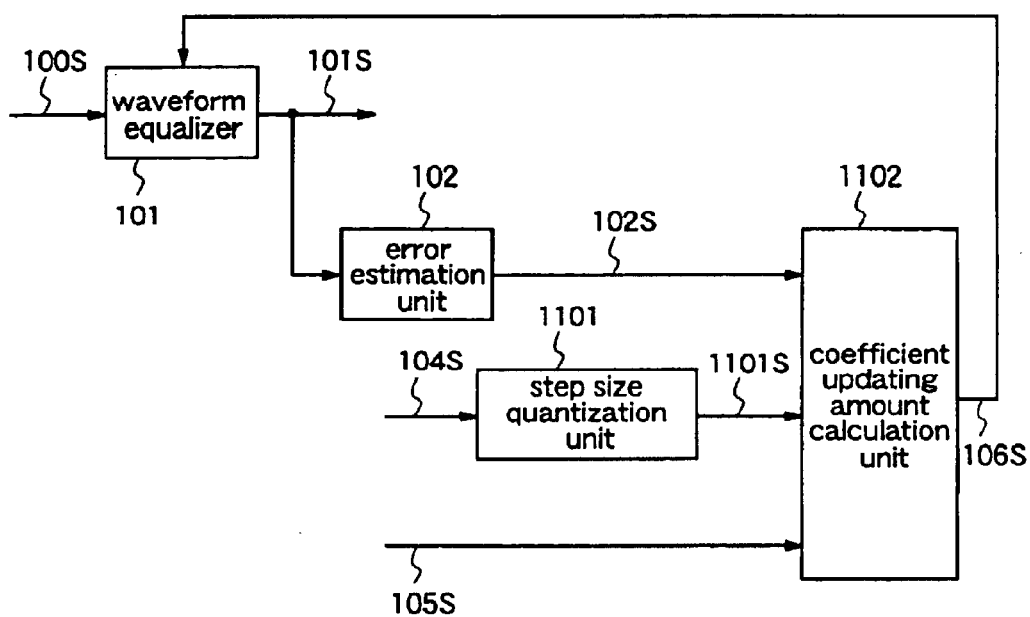
FIG. 11 is a block diagram illustrating a structure of a waveform equalization controller according to a sixth embodiment of the present invention.

FIG. 11 is a block diagram illustrating a structure of the waveform equalization controller according to the sixth embodiment. In FIG. 11, the waveform equalization controller of the sixth embodiment comprises: a waveform equalizer 101 for outputting an output signal 101S which is obtained by reducing the transmission line distortion of an input signal 100S based on the LMS algorithm; an error estimation unit 102 for estimating the error of the output signal 101S and outputting an error signal 102S; a step size quantization unit 1101 for converting a step size 104S into a quantized step size 1101S having a value of powers of 2 and outputting the quantized step size 1101S; and a coefficient updating amount calculation unit 1102 for calculating a tap coefficient updating amount 106S based on the error signal 102S, the quantized step size 1101S and a coefficient updating data 105S to be used for the coefficient update.

Figure 12:
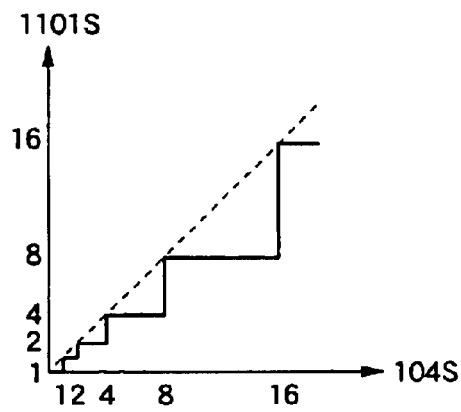
FIG. 12 is a diagram showing the relationship between a step size and a quantized step size of the waveform equalization controller according to the sixth embodiment.

The operation of the waveform equalization controller according to the sixth embodiment will now be described with reference to the drawings. The error estimation unit 102 estimates the error of the output signal 101S based on the output signal 101S that is outputted from the waveform equalizer 101 to be used for the tap coefficient update, and outputs the estimated error as the error signal 102S. The step size quantization unit 1101 converts the step size 104S into the quantized step size 1101S having the maximum value which is equal to or smaller than the step size 104S among the powers of 2, and outputs the quantized step size 1101S. FIG. 12 shows the relationship between the step size 104S and the quantized step size which is obtained by converting the step size 104S. Here, assume that when the step size 104S is "0", the quantized step size 1101S is also "0". The coefficient updating amount calculation unit 1102 receives the error signal 102S, the quantized step size 1101S and the coefficient updating data 105S. When the quantized step size 1101S taking on only the powers of 2 or "0" is used, the process of multiplying the error can be replaced with the shift operation. Therefore, the coefficient updating amount calculation unit 1102 replaces the process which is performed by the two-time multiplication in the prior art with one multiplication and one shift operation, and outputs the tap coefficient updating amount 106S.

As described above, according to the waveform equalization controller of the sixth embodiment, the step size 104S is converted by the step size quantization unit 1101 into the quantized step size 101S having a value of the powers of 2, and the tap coefficient updating amount 106S is obtained by using the quantized step size 1101S. Therefore, in the coefficient updating amount calculation unit 1102, the multiplication can be replaced with the shift operation. Accordingly only one multiplier for calculating the coefficient updating amount of one tap is required, and as a result, the circuit scale can be reduced.

In this sixth embodiment, when the step size 104S is to be converted into the quantized step size 1101S, the conversion as shown in FIG. 12 is performed. However, the step size 104S can be converted into a quantized step size 1101S having the minimum value which is equal to or larger than the step size 104S among the powers of 2. Alternatively, the step size 104S can be converted into a quantized step size 1101S having a value which is nearest to the step size 104S among the powers of 2.

Seventh Embodiment

A waveform equalization controller according to the seventh embodiment will now be described with reference to the drawings.

Figure 13:
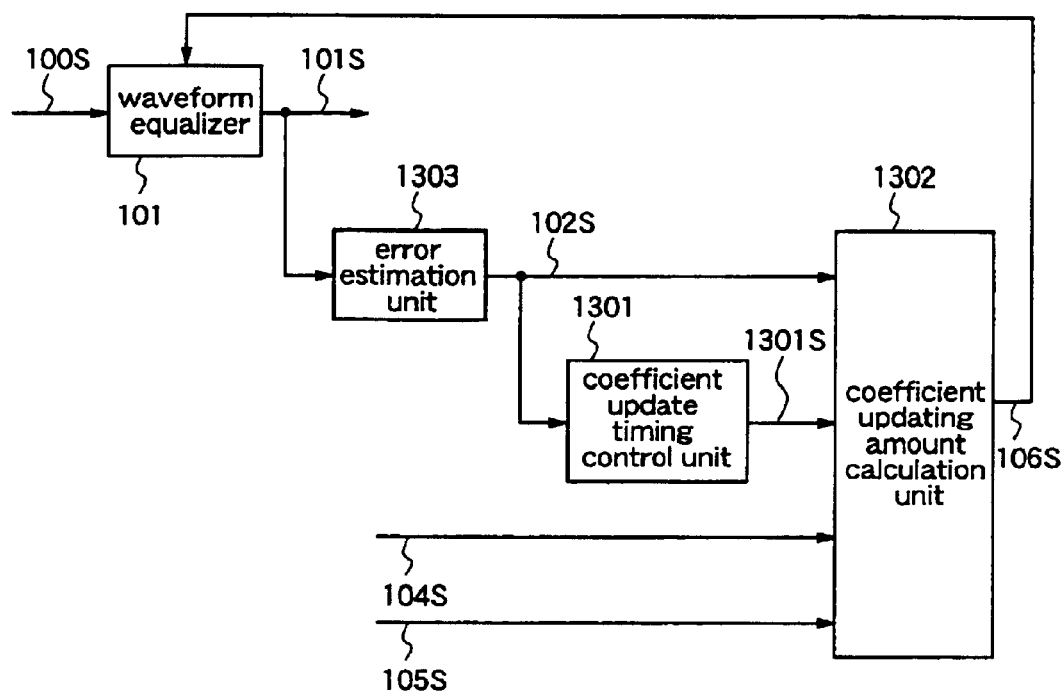
FIG. 13 is a block diagram illustrating a structure of a waveform equalization controller according to a seventh embodiment of the present invention.

FIG. 13 is a block diagram illustrating a structure of the waveform equalization controller according to the seventh embodiment. In FIG. 13, the waveform equalization controller according to the seventh embodiment comprises: a waveform equalizer 101 for outputting an output signal 101S which is obtained by reducing the transmission line distortion of an input signal 100S based on the LMS algorithm; an error estimation unit 1303 for estimating the error of the output signal 101S and outputting an error signal 102S which is obtained by making the estimated error "0" when the error corresponds to a predetermined range of the output signal 101S; a coefficient update timing control unit 1301 for receiving the error signal 102S and outputting an update timing signal 1301S which controls the timing of calculation of the coefficient updating amount of the tap; and a coefficient updating amount calculation unit 1302 for calculating a tap coefficient updating amount 106S based on the error signal 102S, the update timing signal 1301S, a step size 104S and a coefficient updating data 105S to be used for the coefficient update.

The operation of the waveform equalization controller according to the seventh embodiment will now be described with reference to the drawings.

Figure 27:
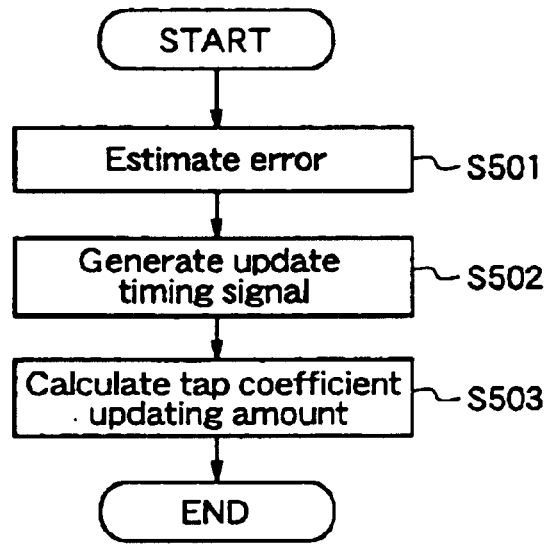
FIG. 27 is a flowchart showing the operation of the waveform equalization controller according to the seventh embodiment.

FIG. 27 is a flowchart showing the operation of the waveform equalization controller according to the seventh embodiment. FIGS. 14(a)–14(d) are diagrams for explaining the timing of the tap coefficient update in the waveform equalization controller of the seventh embodiment.

Figure 14:
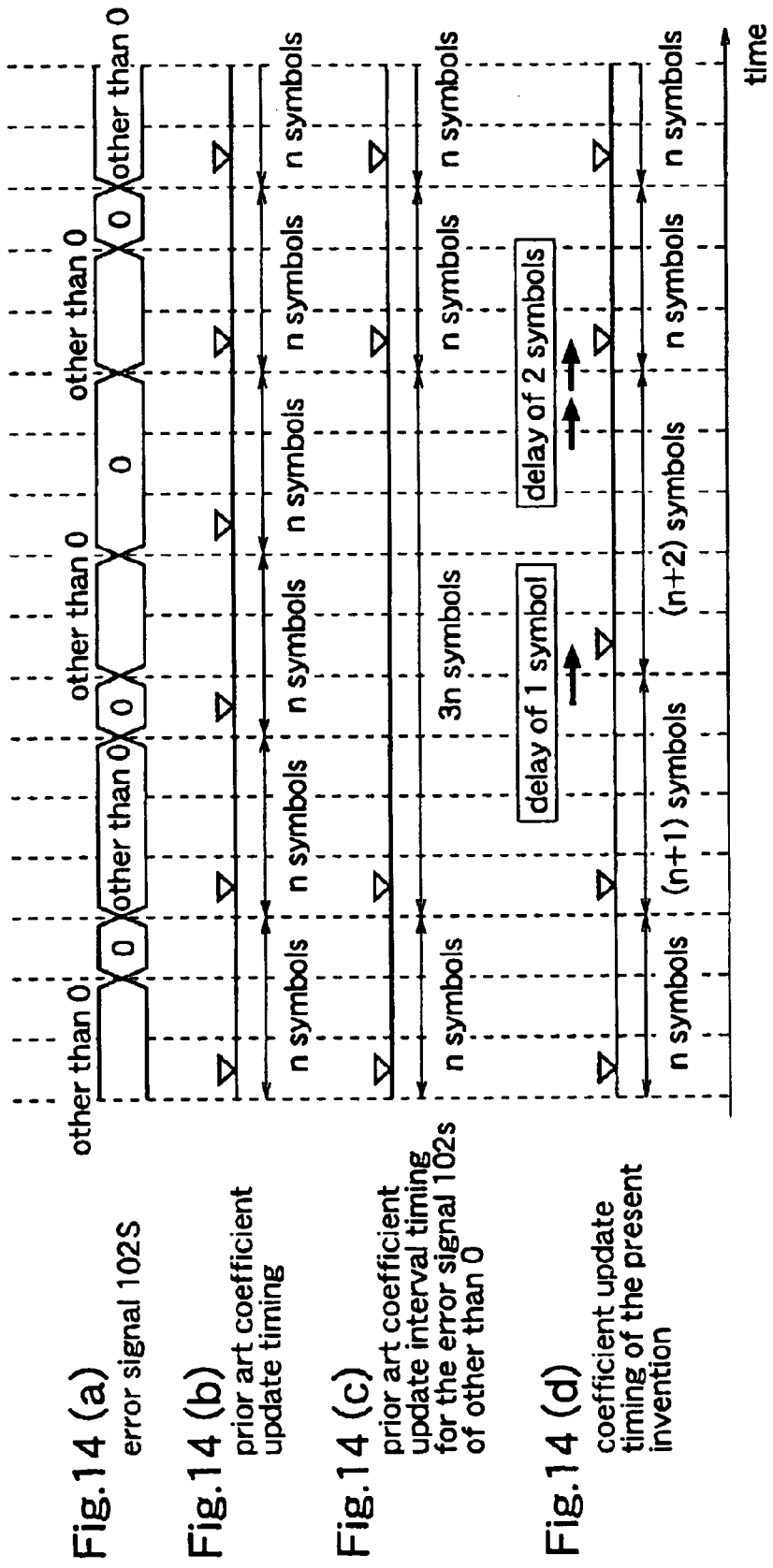
FIG. 14(a)–14(d) are diagrams for explaining the timing of a tap coefficient update in the waveform equalization controller according to the seventh embodiment.

The error estimation unit 1303 estimates the error of the output signal 101S based on the output signal 101S that is outputted from the waveform equalizer 101 to be used for the tap coefficient update, generates the error signal 102S based on the estimated error, and outputs the error signal 102S (step S501). Here, the error estimation unit 1303 generates the error signal 102S based on a Stop&Go algorithm. As shown in FIG. 14(d), the coefficient update timing control unit 1301 turns the update timing signal 1301S ON at the first symbol after a predetermined symbol interval (in this case "n" symbols, where "n" is an integer of 1 or more) or more from the previous coefficient update timing and when the error signal 102S is not "0". At other symbols, the update timing signal 1301S is turned OFF (step S502). The coefficient updating amount calculation unit 1302 receives the error signal 102S, the step size 104S and the coefficient updating data 105S only when the update timing signal 1301S is ON, then performs the multiplication of these as shown in the second term on the right side of the above-mentioned (Expression 1), and outputs the tap coefficient updating amount 106S (step S503). Then, the tap coefficient updating amount 106S is used in the waveform equalizer 101 to update the tap coefficient shown by (Expression 1). Here, the processes of steps S501 to S503 and the update of the tap coefficient in the waveform equalization is performed in the waveform equalizer 101.

In the prior art waveform equalization controller, the coefficient updating amount calculation unit 103 outputs the tap coefficient updating amount 106S at predetermined symbol intervals (here "n" symbols, where "n" is an integer of 1 or more) as shown in FIG. 14(b). When the error signal 102S is generated by using the Stop&Go algorithm, the error signal 102S which is output by the error estimation unit 1303 takes on "0" with a probability of about 50% as shown in FIG. 22(b). Since the tap coefficient updating amount 106S is obtained by −α×e(n)×di(n), when the error signal 102S is "0", i.e., when e(n)=0, the tap coefficient updating amount becomes "0". That is, although the coefficient updating amount calculation unit 103 outputs the tap coefficient updating amounts 106S once for every n symbols, where about half of the tap coefficient updating amounts are "0". Accordingly, the substantial coefficient update interval is 2n symbols as shown in FIG. 14(c).

In this seventh embodiment, as shown in FIG. 14(d), the substantial coefficient update interval is approximately (n+1) symbols, and therefore, the interval is reduced by about half with respect to the prior art.

As described above, according to the waveform equalization controller of the seventh embodiment, the coefficient updating amount calculation unit 1302 comprises the coefficient update timing control unit 1301 for controlling the timing of calculation of the tap coefficient updating amount 106S. Therefore, the substantial coefficient update interval is reduced greatly and the convergence speed of the waveform equalizer 101 can be increased.

In this seventh embodiment, a description was given of the waveform equalization controller using the Stop&Go algorithm. However, the present invention is not limited to this waveform equalization controller. For example, the present invention can also be applied to a waveform equalization controller which may make the error signal 102S "0", i.e., stop the coefficient update operation in some states of the input or output signal.

In addition, the coefficient update timing control unit 1301 of the seventh embodiment is not limited to the unit which turns the update timing signal 1301S ON at the first symbol after "n" or more symbols from the previous coefficient update timing and when the error signal 102S is not "0". For example, a coefficient update timing control unit which monitors the error signal 102S to thereby turn the update timing signal 1301S ON, such as a coefficient update timing control unit which turns the update timing signal 1301S ON at the second symbol after "n" or more symbols from the previous coefficient update timing and when the error is signal 102S is not "0", is included in the present invention.

In addition, in this seventh embodiment, the timing of the coefficient update is controlled by turning the update timing signal 1301S ON or OFF. However, the present invention is not limited thereto. For example, the update timing for the tap coefficient can be controlled by changing the kind of an identifier that is included in the update timing signal 1301S. In this seventh embodiment, "generating the update timing signal 1301S" includes turning the update timing signal 1301S ON or OFF.

Eighth Embodiment

A waveform equalization controller according to the eighth embodiment of the present invention will now be described with reference to the drawings.

FIG. 15 is a block diagram illustrating a structure of the waveform equalization controller according to the eighth embodiment. In FIG. 15, the waveform equalization controller of the eighth embodiment comprises: a waveform equalizer 101 for outputting an output signal 101S which is obtained by reducing the transmission line distortion of an input signal 100S based on the LMS algorithm; an error estimation unit 1501 for estimating the error of the output signal 101S and outputting an error signal 1502S; and a coefficient updating amount calculation unit 103 for calculating a tap coefficient updating amount 106S based on the error signal 1502S, a step size 104S, and a coefficient updating data 105S to be used for the coefficient update. The error estimation unit 1501 comprises an output error estimation unit 1502 for receiving the output signal 101S and outputting an output error signal 1501S, and a coefficient updating error generation unit 1503 for receiving the output error signal 1501S and the output signal 101S, reducing a partial section of the output error signal 1501S at a predetermined ratio, and outputting the error signal 1502S.

The operation of the waveform equalization controller according to the eighth embodiment will now be described with reference to the drawings. Here, a description is provided by using a case, as an example, where the input signal to the waveform equalizer is the DTV signal.

Figure 28:
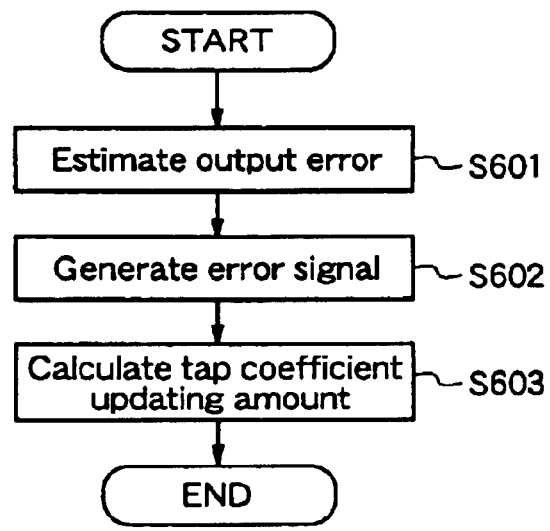
FIG. 28 is a flowchart showing the operation of the waveform equalization controller according to the eighth embodiment.

FIG. 28 is a flowchart showing the operation of the waveform equalization controller according to the eighth embodiment.

The output error estimation unit 1502 estimates the output error which is an error between the most likely symbol value and the output signal 101S that is outputted from the waveform equalizer 101, and generates the output error signal 1501S (step S601). The coefficient updating error generation unit 1503 receives the output error signal 1501S and the output signal 101S, generates a value of 25% of the output error signal 1501S as the error signal 1502S for the output error signal 1501S outputting "0" according to the Stop&Go algorithm as shown in FIG. 22(b), and outputs this value (step S602). FIG. 16 shows the relationship between the output error signal 1501S and the error signal 1502S. The coefficient updating amount calculation unit 103 receives the error signal 1502S, the step size 104S and the data 105S, performs the multiplication of these as shown in the second term on the right side of the above-mentioned (Expression 1), and outputs the tap coefficient updating amount 106S (step S603). Then, the tap coefficient updating amount 106S is used in the waveform equalizer 101 to update the tap coefficient shown by (Expression 1). Here, the processes of steps S601 to S603 and the updating of the tap coefficient in the waveform equalizer 101 are repeated as long as the waveform equalization is performed in the waveform equalizer 101.

As described above, according to the waveform equalization controller of the eighth embodiment, the coefficient updating error generation unit 1503 for converting the output error signal into the value of 25% of the output error signal 1501S and outputting the value is provided instead of the coefficient updating error generation unit for converting the output error signal into "0" and outputting the error signal in the Stop&Go algorithm. Therefore, the error signals which can be used for updating the tap coefficient are increased in number and the convergence speed of the waveform equalizer 101 can be increased.

In this eighth embodiment, a description is given of a case where the input signal is the DTV signal. However, the input signal is not limited to the DTV signal. Further, the ratio which is used by the coefficient updating error generation unit 1503 to convert the output error signal is not limited to 25%.

Ninth Embodiment

A waveform equalization controller according to the ninth embodiment of the present invention will now be described with reference to the drawings.

Figure 17:
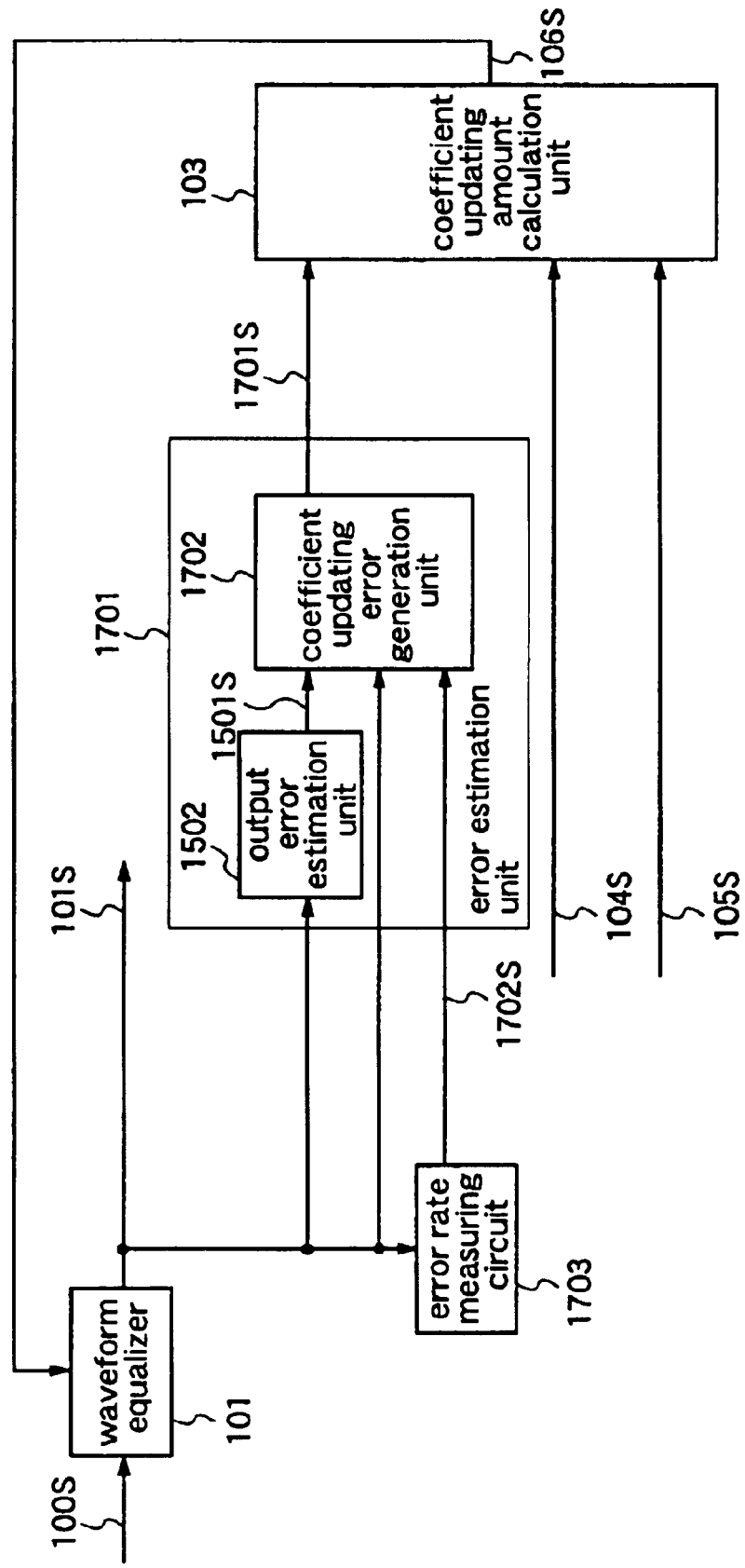
FIG. 17 is a block diagram illustrating a structure of a waveform equalization controller according to a ninth embodiment of the present invention.

FIG. 17 is a block diagram illustrating a structure of the waveform equalization controller according to the ninth embodiment. In FIG. 17, the waveform equalization controller of the ninth embodiment comprises: a waveform equalizer 101 for outputting an output signal 101S which is obtained by reducing the transmission line distortion of an input signal 100S based on the LMS algorithm; an error estimation unit 1701 for estimating the error of the output signal 101S and outputting an error signal 1701S; a coefficient updating amount calculation unit 103 for calculating a tap coefficient updating amount 106S based on the error signal 1701S, a step size 104S and a coefficient updating data 105S to be used for the coefficient update; and an error rate measuring circuit 1703 for measuring an error rate of the data based on the output signal 101S and outputting the error rate as an error rate signal 1702S. The error estimation unit 1701 comprises an output error estimation unit 1502 for receiving the output signal 101S and outputting an output error signal 1501S, and a coefficient updating error generation unit 1702 for receiving the output error signal 1501S, the output signal 101S and the error rate signal 1702S and outputting the error signal 1701S.

The operation of the waveform equalization controller according to the ninth embodiment will now be described with reference to the drawings. Here, a description is provided by using a case, as an example, where the input to the waveform equalizer 101 is the DTV signal.

Figure 29:
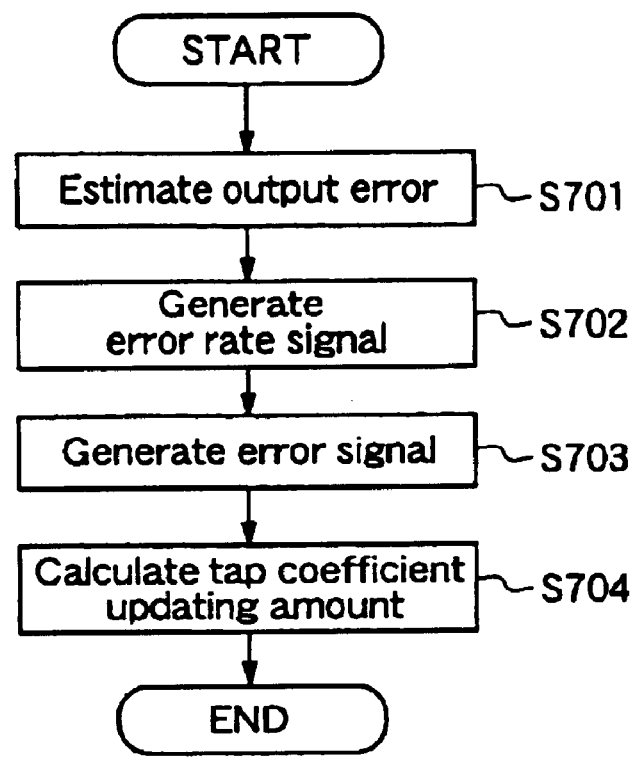
FIG. 29 is a flowchart showing the operation of the waveform equalization controller according to the ninth embodiment.

FIG. 29 is a flowchart showing the operation of the waveform equalization controller according to the ninth embodiment.

The output error estimation unit 1502 estimates the output error as the error between the most likely symbol value and the output signal 101S that is outputted from the waveform equalizer 101, and generates the output error signal 1501S (step S701). The error rate measuring circuit 1703 turns the error rate signal 1702S ON when the error rate indicating a rate of the error that is included in the output signal 101S outputted from the waveform equalizer 101 becomes equal to or larger than a predetermined value, for example 10%, and turns the error rate signal 1702S OFF in other cases (step S702). Here, the error rate measuring circuit 1703 measures the error rate by using data for ECC that are included in the output signal 101S, bits for ECC or the like.

The coefficient updating error generation unit 1702 receives the output error signal 1501S, the output signal 101S and the error rate signal 1702S. When the error rate signal 1702S is ON, the coefficient updating error generation unit 1702 outputs the same signal as the error signal as shown in FIG. 22(b) based on the Stop&Go algorithm similar to the prior art. When the error rate signal 1702S is OFF, the output error signal 1501S shows a nearly correct value. Therefore, the conversion based on the Stop&Go algorithm is not performed, and the output error signal 1501S is output in its current form as the error signal 1701S (step S703). FIG. 18 shows the relationship between the output error signal 1501S and the error signal 1701S in the case where the error rate signal 1702S is OFF. The coefficient updating amount calculation unit 103 receives the error signal 1701S, the step size 104S and the coefficient updating data 105S, performs the multiplication of these as shown in the second term on the right side of the above-mentioned (Expression 1), and outputs the tap coefficient updating amount 106S (step S704). Then, the tap coefficient updating amount 106S is used in the waveform equalizer 101 to update the tap coefficient shown by (Expression 1). Here, the processes of steps S701 to S704 and the update of the tap coefficient in the waveform equalizer 101 are repeated as long as the waveform equalization is performed in the waveform equalizer 101.

As described above, according to the waveform equalization controller of the ninth embodiment, the error rate measuring circuit 1703 which turns the error rate signal 1702S ON or OFF according to the error rate of the output signal 101S in the Stop&Go algorithm, and the coefficient updating error generation unit 1702 that outputs the error signal 1701S which is obtained by converting part of the output error signal 1501S into "0" when the error rate signal 1702S is ON and outputs the output error signal 1501S in its current form without converting the part into "0" when the error rate signal is OFF are provided. Therefore, the error signals 1701S which can be used for the tap coefficient update are increased in number, and as a result, the convergence speed of the waveform equalizer 101 can be improved.

In this ninth embodiment, a description was given of the case where the input signal is the DTV signal. However, the input signal is not limited to the DTV signal.

In addition, the threshold of the error rate at which the error rate measuring circuit 1703 switches the error rate signal 1702S between ON and OFF is set at 10% in this embodiment. However, the threshold is not limited to this value.

Further, when the error rate signal 1702S is ON, the coefficient updating error generation unit 1702 generates the error signal 1701S based on the Stop&Go algorithm in this ninth embodiment. However, the present invention is not limited thereto. For example, the coefficient updating error generation unit 1702 can output the error signal 1502S as shown in FIG. 16(b) of the eighth embodiment when the error rate signal 1702S is ON. As long as the error signal 1701S that is outputted from the coefficient updating error generation unit 1702 when the error rate signal 1702S is ON is not the same as the output error signal 1501S, i.e., is a signal which is obtained by attenuating the output error signal 1501S in a predetermined range or at a predetermined ratio or making the output error signal 1501S "0", this is included in the scope of the present invention.

In addition, in this ninth embodiment, the error rate signal 1702S is generated by the error rate measuring circuit 1703 as ON or OFF. However, the present invention is not limited thereto. For example, whether the error rate is equal to or more than the predetermined value or not can be shown by changing the kind of an identifier that is included in the error rate signal 1702S. In this ninth embodiment, "generating the error rate signal 1702S" includes turning the error rate signal 1702S ON or OFF.

Further, when the output signal 101S of the waveform equalizer 101 is input to a Forward Error Correction Unit (not shown), an error rate measuring circuit which is included in the Forward Error Correction Unit can be used as the error rate measuring circuit 1703 according to the ninth embodiment.

What is claimed is:

1. A waveform equalization controller comprising:
a waveform equalizer operable to reduce a transmission line distortion of an input signal based on a LMS algorithm, and to output an output signal, wherein said waveform equalization controller is operable to control updating of a tap coefficient of a filter which is included in said waveform equalizer;
an error estimation unit operable to estimate an error of the output signal outputted from said waveform equalizer based on the output signal, and to output an error signal;

a step size decision unit operable to receive the error signal outputted from said error estimation unit and a step size upper limit value and a step size lower limit value, which are an upper limit value and a lower limit value of a possible step size as a step for updating the tap coefficient, respectively, to adaptively generate a step size corresponding to the error signal in a range of the step size upper limit value or smaller and the step size lower limit value or larger, and to output the generated step size; and a coefficient updating calculation unit operable to calculate a tap coefficient amount based on the error signal outputted from said error estimation unit, the generated step size outputted from said step size decision unit, and a data to be used for updating the tap coefficient;

wherein said step size decision unit comprises:
a multiplier operable to square the error signal so as to generate and output a square error;
a square error storage unit operable to store a previous square error which has been generated at a previous tap coefficient update;
a subtracter operable to generate a difference between square errors, the difference between the square errors being a difference between the square error outputted from said multiplier and the previous square error stored in said square error storage unit;
a first comparator operable to compare the square error outputted from said multiplier with a first threshold;
a second comparator operable to compare the square error outputted from said multiplier with a second threshold;
a third comparator operable to compare an absolute value of the difference between the square errors with a third threshold;
a step size storage unit operable to store a previous step size which has been used at the previous tap coefficient update; and
a step size increasing/decreasing unit operable to receive the previous step size stored in said step size storage unit, an output of said first comparator, an output of said second comparator, an output of said third comparator, the step size upper limit value and the step size lower limit value, and to generate a step size which is to be used for updating the tap coefficient.

2. The waveform equalization controller according to claim 1, wherein:
a value of the second threshold is such that when the square error is larger than the value of the second threshold, an operation of said waveform equalizer is trending toward divergence;
a value of the first threshold is such that when the square error is smaller than the value of the first threshold, the operation of said waveform equalizer is either converging or has converged;
a value of the third threshold is such that when the square error is smaller than the value of the first threshold,
the operation of said waveform equalizer is converging when an absolute value of the difference between the square errors is larger than the third threshold, and
the operation of said waveform equalizer has converged when the absolute value of the difference between the square errors is equal to or smaller than the third threshold; and
said step size increasing/decreasing unit is operable to
decrease the step size by a first predetermined amount when it is judged from comparison results of said first to third comparators that the square error is larger than the second threshold,
decrease the step size by a second predetermined amount when the square error is smaller than the first threshold and the absolute value of the difference between the square errors is equal to or smaller than the third threshold,
increase the step size by a third predetermined amount when the square error is smaller than the first threshold and the absolute value of the difference between the square errors is larger than the third threshold, and
not change the step size in other cases.

3. The waveform equalization controller according to claim 1, wherein:
a value of the second threshold is such that when the square error is larger than the value of the second threshold, an operation of said waveform equalizer is trending toward divergence;
a value of the first threshold is such that when the square error is smaller than the value of the first threshold, the operation of said waveform equalizer is either converging or has converged;
a value of the third threshold is such that when the square error is smaller than the first threshold,
the operation of said waveform equalizer is converging when an absolute value of the difference between the square errors is larger than the third threshold, and
the operation of said waveform equalizer has converged when the absolute value of the difference between the square errors is equal to or smaller than the third threshold; and
said step size increasing/decreasing unit is operable to
decrease the step size at a first predetermined rate when it is judged from comparison results of said first to third comparators that the square error is larger than the second threshold,
decrease the step size at a second predetermined rate when the square error is smaller than the first threshold and the absolute value of the difference between the square errors is equal to or smaller than the third threshold,
increase the step size at a third predetermined rate when the square error is smaller than the first threshold and the absolute value of the difference between the square errors is larger than the third threshold, and
not change the step size in other cases.

4. A waveform equalization controller comprising:
waveform equalizer means for reducing a transmission line distortion of an input signal based on a LMS algorithm, and for outputting an output signal, wherein said waveform equalization controller controls updating of a tap coefficient of a filter which is included in said waveform equalizer means;
error estimation means for estimating an error of the output signal outputted from said waveform equalizer means based on the output signal, and for outputting an error signal;
step size decision means for receiving the error signal outputted from said error estimation means and a step size upper limit value and a step size lower limit value, which are an upper limit value and a lower limit value of a possible step size as a step for updating the tap coefficient, respectively, for adaptively generating a step size corresponding to the error signal in a range of the step size upper limit value or smaller and the step size lower limit value or larger, and for outputting the generated step size; and coefficient updating calculation means for calculating a tap coefficient amount based on the error signal outputted from said error estimation means, the generated step size outputted from said step size decision means, and a data to be used for updating the tap coefficient;

wherein said step size decision means comprises:

multiplier means for squaring the error signal so as to generate and output a square error;

square error storage means for storing a previous square error which has been generated at a previous tap coefficient update;

subtracter means for generating a difference between square errors, the difference between the square errors being a difference between the square error outputted from said multiplier means and the previous square error stored in said square error storage means;

first comparator means for comparing the square error outputted from said multiplier means with a first threshold;

second comparator means for comparing the square error outputted from said multiplier means with a second threshold;

third comparator means for comparing an absolute value of the difference between the square errors with a third threshold;

step size storage means for storing a previous step size which has been used at the previous tap coefficient update; and step size increasing/decreasing means for receiving the previous step size stored in said step size storage means, an output of said first comparator means, an output of said second comparator means, an output of said third comparator means, the step size upper limit value and the step size lower limit value, and for generating a step size which is to be used for updating the tap coefficient.

5. The waveform equalization controller according to claim 4, wherein:

a value of the second threshold is such that when the square error is larger than the value of the second threshold, an operation of said waveform equalizer means is trending toward divergence;

a value of the first threshold is such that when the square error is smaller than the value of the first threshold, the operation of said waveform equalizer means is either converging or has converged;

a value of the third threshold is such that when the square error is smaller than the value of the first threshold, the operation of said waveform equalizer means is converging when an absolute value of the difference between the square errors is larger than the third threshold, and the operation of said waveform equalizer means has converged when the absolute value of the difference between the square errors is equal to or smaller than the third threshold; and said step size increasing/decreasing means decreases the step size by a first predetermined amount when it is judged from comparison results of said first to third comparator means that the square error is larger than the second threshold, decreases the step size by a second predetermined amount when the square error is smaller than the first threshold and the absolute value of the difference between the square errors is equal to or smaller than the third threshold, increases the step size by a third predetermined amount when the square error is smaller than the first threshold and the absolute value of the difference between the square errors is larger than the third threshold, and does not change the step size in other cases.

6. The waveform equalization controller according to claim 4, wherein:

a value of the second threshold is such that when the square error is larger than the value of the second threshold, an operation of said waveform equalizer means is trending toward divergence;

a value of the first threshold is such that when the square error is smaller than the value of the first threshold, the operation of said waveform equalizer means is either converging or has converged;

a value of the third threshold is such that when the square error is smaller than the first threshold, the operation of said waveform equalizer means is converging when an absolute value of the difference between the square errors is larger than the third threshold, and the operation of said waveform equalizer means has converged when the absolute value of the difference between the square errors is equal to or smaller than the third threshold; and said step size increasing/decreasing means decreases the step size at a first predetermined rate when it is judged from comparison results of said first to third comparator means that the square error is larger than the second threshold, decreases the step size at a second predetermined rate when the square error is smaller than the first threshold and the absolute value of the difference between the square errors is equal to or smaller than the third threshold, increases the step size at a third predetermined rate when the square error is smaller than the first threshold and the absolute value of the difference between the square errors is larger than the third threshold, and does not change the step size in other cases.

7. A waveform equalization control method for controlling updating of a tap coefficient of a filter which is included in a waveform equalizer for reducing a transmission line distortion of an input signal based on a LMS algorithm, said method comprising:

estimating an error of an output signal outputted from the waveform equalizer based on the output signal, and generating an error signal;

adaptively deciding, based on the error signal generated in said generating of the error signal, a step size in a range of a step size upper limit value, which is an upper limit value of a step size as a step for updating the tap coefficient, or smaller, and a step size lower limit value, which is a lower limit value of the step size, or larger; and calculating a tap coefficient updating amount based on the error signal generated in said generating of the error signal, the step size decided in said adaptively deciding of the step size, and a data to be used for updating the tap coefficient;

wherein said adaptively deciding of the step size comprises:

squaring the error signal so as to generate and output a square error;

generating a difference between square errors, which is a difference between a previous square error generated at a previous tap coefficient update and the square error generated in said squaring of the error signal;

comparing the square error generated in said squaring of the error signal with a first threshold;

comparing the square error generated in said squaring of the error signal with a second threshold;

comparing an absolute value of the difference between the square errors with a third threshold; and generating a step size which is to be used for updating the tap coefficient based on a previous step size which has been used at a previous tap coefficient update, a comparison result of said comparing of the square error with the first threshold, a comparison result of said comparing of the square error with the second threshold, a comparison result of said comparing of the absolute value of the difference between the square errors with the third threshold, the step size upper limit value and the step size lower limit value.

* * * * *